(12) United States Patent
Lin et al.

(10) Patent No.: US 11,862,525 B2
(45) Date of Patent: Jan. 2, 2024

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Tsung-Yu Lin, Kaohsiung (TW); Pei-Yu Wang, Kaohsiung (TW); Chung-Wei Hsu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/695,757

(22) Filed: Mar. 15, 2022

(65) Prior Publication Data

US 2022/0208623 A1 Jun. 30, 2022

Related U.S. Application Data

(63) Continuation of application No. 16/851,006, filed on Apr. 16, 2020, now Pat. No. 11,276,616, which is a
(Continued)

(51) Int. Cl.
*H01L 23/10* (2006.01)
*H01L 23/00* (2006.01)
(Continued)

(52) U.S. Cl.
CPC .............. *H01L 23/10* (2013.01); *H01L 21/50* (2013.01); *H01L 23/04* (2013.01); *H01L 23/053* (2013.01);
(Continued)

(58) Field of Classification Search
CPC ......... H01L 23/10; H01L 21/50; H01L 23/04; H01L 23/053; H01L 24/48; H01L 33/486; H01L 24/16; H01L 2224/16225; H01L 2224/48091; H01L 2224/48225; H01L 2224/48227; H01L 2224/8592; H01L 2924/00014; H01L 2924/12041; H01L 2924/12043; H01L 2924/15151;
(Continued)

(56) References Cited

U.S. PATENT DOCUMENTS

2008/0013959 A1 1/2008 Ishigami
2008/0036103 A1 2/2008 Ban et al.
(Continued)

FOREIGN PATENT DOCUMENTS

TW 506622 U 10/2002

OTHER PUBLICATIONS

Final Office Action for U.S. Appl. No. 16/851,006, dated Jul. 9, 2021, 9 pages.
(Continued)

*Primary Examiner* — Elias Ullah
(74) *Attorney, Agent, or Firm* — FOLEY & LARDNER LLP

(57) ABSTRACT

A semiconductor device package includes a supporting element, a transparent plate disposed on the supporting element, a semiconductor device disposed under the transparent plate, and a lid surrounding the transparent plate. The supporting element and the transparent plate define a channel.

20 Claims, 26 Drawing Sheets

Related U.S. Application Data continuation of application No. 15/844,276, filed on Dec. 15, 2017, now Pat. No. 10,658,255.

(60) Provisional application No. 62/441,901, filed on Jan. 3, 2017.

(51) Int. Cl.
| | |
|---|---|
| *H01L 23/053* | (2006.01) |
| *H01L 21/50* | (2006.01) |
| *H01L 33/48* | (2010.01) |
| *H01L 23/04* | (2006.01) |
| *G01L 19/14* | (2006.01) |

(52) U.S. Cl.
CPC ............ *H01L 24/48* (2013.01); *H01L 33/486* (2013.01); *G01L 19/14* (2013.01); *H01L 24/16* (2013.01); *H01L 2224/16225* (2013.01); *H01L 2224/48091* (2013.01); *H01L 2224/48225* (2013.01); *H01L 2224/48227* (2013.01); *H01L 2224/8592* (2013.01); *H01L 2924/00014* (2013.01); *H01L 2924/12041* (2013.01); *H01L 2924/12043* (2013.01); *H01L 2924/15151* (2013.01); *H01L 2924/15153* (2013.01); *H01L 2924/1659* (2013.01); *H01L 2924/16195* (2013.01); *H01L 2924/17151* (2013.01)

(58) Field of Classification Search
CPC . H01L 2924/15153; H01L 2924/16195; H01L 2924/1659; H01L 2924/17151; H01L 23/13; H01L 23/28; G01L 19/14
See application file for complete search history.

(56) References Cited

U.S. PATENT DOCUMENTS

2009/0180013 A1* 7/2009 Kinoshita ......... H01L 27/14618
                                                        348/308
2011/0249109 A1  10/2011 Fine

OTHER PUBLICATIONS

Final Office Action for U.S. Appl. No. 15/844,276, dated Feb. 4, 2019, 11 pages.
Non-Final Office Action for U.S. Appl. No. 16/851,006, dated Feb. 19, 2021, 8 pages.
Non-Final Office Action for U.S. Appl. No. 15/844,276, dated Jun. 28, 2019, 9 pages.
Non-Final Office Action for U.S. Appl. No. 15/844,276, dated Aug. 9, 2018, 11 pages.
Notice of Allowance for U.S. Appl. No. 16/851,006, dated Nov. 8, 2021, 8 pages.
Notice of Allowance for U.S. Appl. No. 15/844,276, dated Jan. 16, 2020, 7 pages.

* cited by examiner

SEMICONDUCTOR DEVICE PACKAGE AND A METHOD OF MANUFACTURING THE SAME

CROSS-REFERENCE TO RELATED APPLICATION

This application is a continuation of U.S. patent application Ser. No. 16/851,006 filed Apr. 16, 2020, now issued as U.S. Pat. No. 11,276,616, which is a continuation of U.S. patent application Ser. No. 15/844,276 filed Dec. 15, 2017, now issued as U.S. Pat. No. 10,658,255, which claims the benefit of and priority to U.S. Provisional Application No. 62/441,901, filed Jan. 3, 2017, the content of which is incorporated herein by reference in its entirety.

BACKGROUND

1. Technical Field

The present disclosure relates to a semiconductor device package, and to a semiconductor device package having a supporting element and a transparent plate on the supporting element, the supporting element and the transparent plate defining a channel.

2. Description of the Related Art

A lid is used to protect a die and other electronic devices on a substrate from moisture, dust, particles, or the like. The lid is glued to the substrate to form a semiconductor device package. However, the lid may be detached from the substrate due to a pop-corn effect (e.g. expansion or movement due to heat) resulting from thermal cycles (e.g. the semiconductor device package may be heated to cure the glue between the lid and the substrate) in an operation of manufacturing the semiconductor device package.

SUMMARY

In some embodiments, according to one aspect, a semiconductor device package includes a supporting element, a transparent plate disposed on the supporting element, a semiconductor device disposed under the transparent plate, and a lid surrounding the transparent plate. The supporting element and the transparent plate define a channel.

In some embodiments, according to another aspect, a semiconductor device package includes a substrate, a transparent plate disposed on the substrate, a semiconductor device, and a lid disposed on the substrate. The transparent plate and the substrate define a space. The semiconductor device is disposed in the space. The lid and the transparent plate define a channel. The channel is in fluid communication with the space.

In some embodiments, according to another aspect, a semiconductor device package includes a supporting element, a transparent plate disposed on the supporting element, a semiconductor device disposed under the transparent plate, and a lid surrounding the transparent plate. The transparent plate and the lid define a channel.

DETAILED DESCRIPTION

Figure 1A:
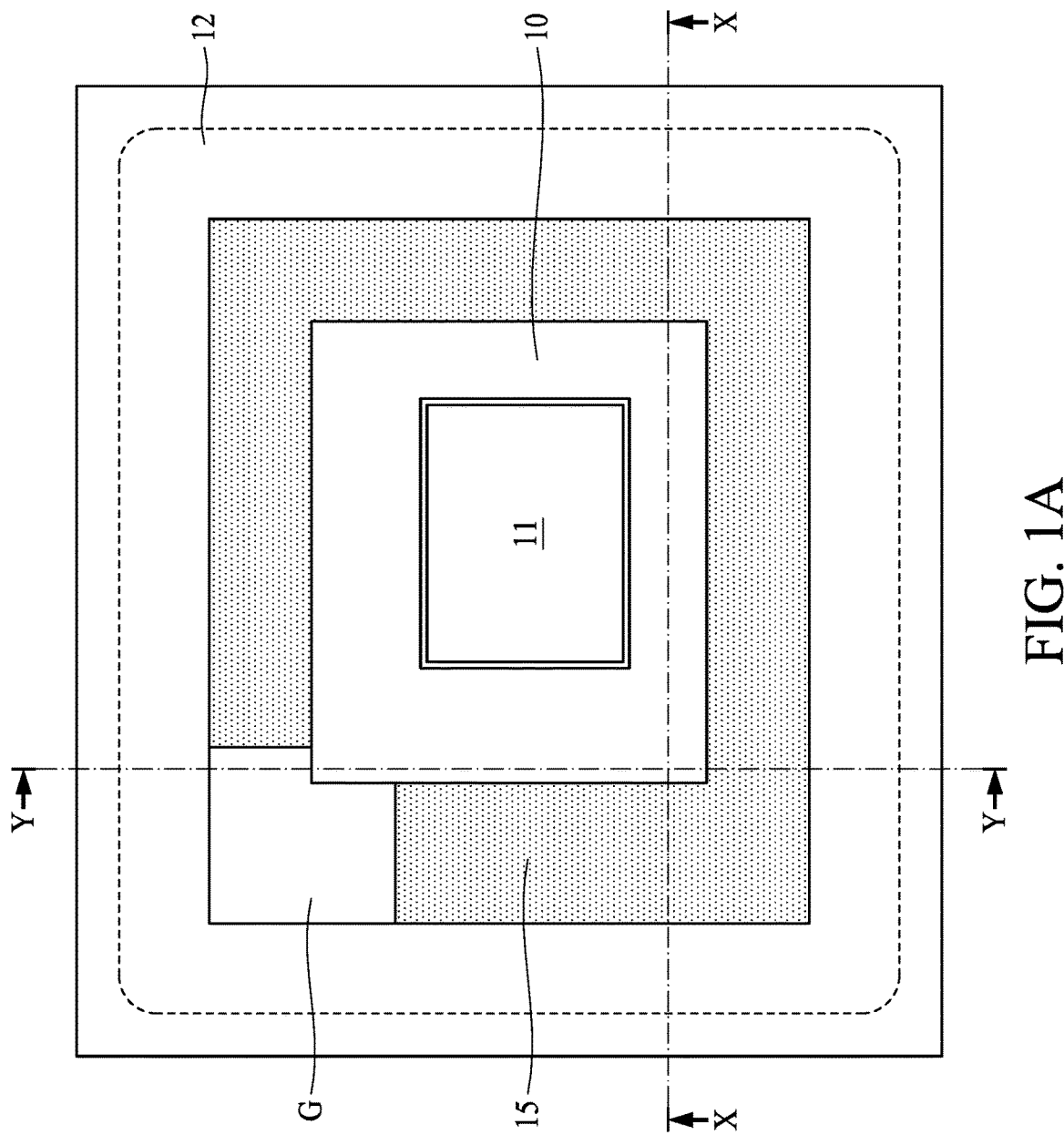
FIG. 1A illustrates a top view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a top view of a semiconductor device package 1 in accordance with some embodiments of the present disclosure. The semiconductor device package 1 includes a substrate 10, a supporting element 12, a semiconductor device 11, and an adhesive 15.

The supporting element 12 is disposed on the substrate 10. The semiconductor device 11 is disposed on the substrate 10. The supporting element 12 defines an opening or a space to accommodate the semiconductor device 11. The supporting element 12 surrounds the semiconductor device 11. The semiconductor device 11 may include light emitting diodes (LEDs), optical sensors, pressure sensors, or other semiconductor devices. The semiconductor device 11 may include a flip-chip type semiconductor device. The semiconductor device 11 may include a wire-bond type semiconductor device.

The adhesive 15 is disposed on the supporting element 12. The adhesive 15 is disposed on an internal periphery of the supporting element 12 (e.g. along an edge of the supporting element 12 that defines the opening or space to accommodate the semiconductor device 11). The adhesive 15 discontinuously surrounds the semiconductor device 11 (e.g. surrounds a portion of semiconductor device 11). One end of the adhesive 15 is separated from another end of the adhesive 15 by a gap (G). In one or more embodiments, the adhesive 15 continuously surrounds a circumference of the semiconductor device 11 other than a portion of the circumference corresponding to the gap (G). In some embodiments, a portion of the supporting element 12 corresponding to the gap (G) (e.g. adjacent to the gap (G)) may constitute at least a portion of a recess or depression of the supporting element 12. An edge of the adhesive 15 is adjacent to the recess. The depth of the recess of the supporting element 12 may be ranged from about 40 µm to about 60 µm. The supporting element 12 may include one or more inner corners, and the gap (G) may be disposed adjacent to one or more of the inner corners of the supporting element 12. The gap (G) may be disposed adjacent to any portion of an inner periphery of the supporting element 12.

Figure 1B:
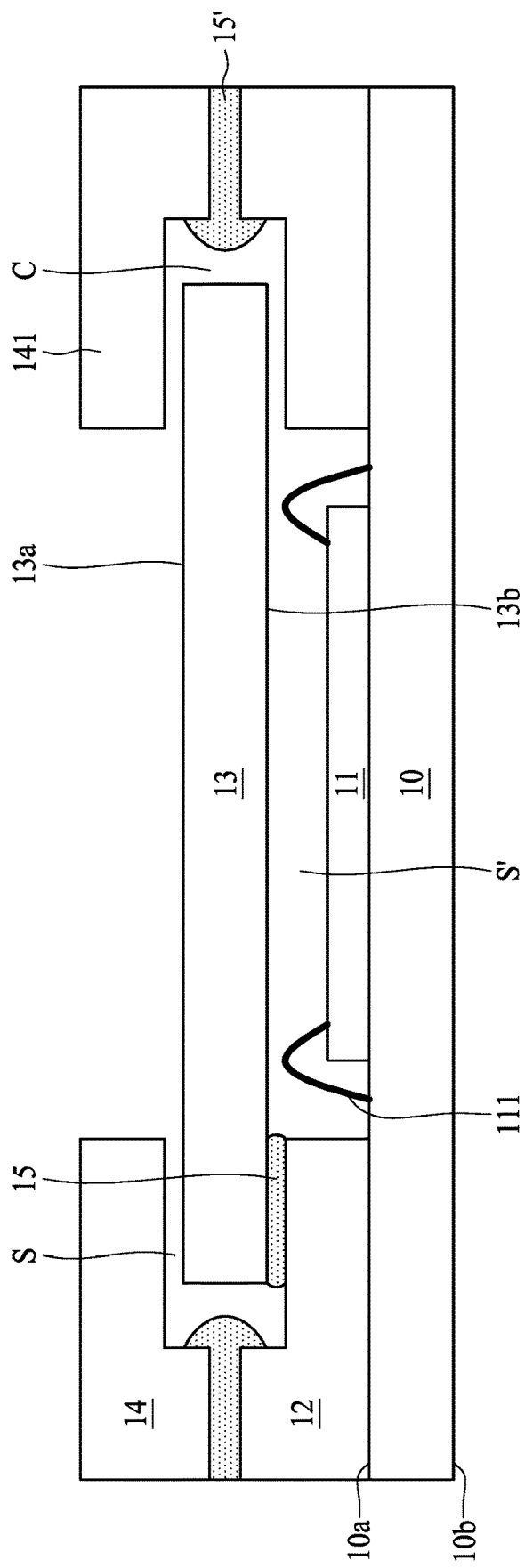
FIG. 1B illustrates a cross-sectional view of a semiconductor device package according to some embodiments of the present disclosure.

FIG. 1B is a cross-sectional view of a semiconductor device package 1 across line Y-Y in FIG. 1A in accordance with some embodiments of the present disclosure. The semiconductor device package 1 includes the substrate 10, the semiconductor device 11, the supporting element 12, a transparent plate/cover 13, the adhesive 15, an adhesive layer 15', and a lid 14.

The substrate 10 has an upper surface 10a and a lower surface 10b opposite to the upper surface 10a. The supporting element 12 is disposed on the upper surface 10a of the substrate 10. The supporting element 12 can be secured to the substrate 10 via the adhesive layer 15' (e.g. a second portion of the adhesive layer 15', not denoted in FIG. 1B). The supporting element 12 has a stepped structure. The supporting element 12 may be a lid. The lid 14 is disposed on the supporting element 12. The lid 14 is secured to the supporting element 12 via the adhesive layer 15'. The lid 14 includes an opaque material (e.g. a material having a transmittance of about 20% or less, or about 10% or less, for light that the semiconductor device 11 is configured to process). The lid 14 includes an extension portion 141. The extension portion 141 extends over at least a portion of the transparent plate 13. The extension portion 141 covers a periphery of the transparent plate 13 (e.g. covers a peripheral portion of an upper surface 13a of the transparent plate 13, the peripheral portion constituting about 20% or less of a total surface area of the upper surface 13a of the transparent plate 13, about 15% or less of the total surface area of the upper surface 13a of the transparent plate 13, about 10% or less of the total surface area of the upper surface 13a of the transparent plate 13, or less). The transparent plate 13 may have a transmittance of about 80% or more, or about 90% or more, for light that the semiconductor device 11 is configured to process. The semiconductor device 11 may be disposed under the transparent plate 13. The extension portion 141 mitigates against light leakage through side surfaces of the transparent plate 13. The supporting element 12 and the lid 14 define an accommodating space (S). A material of the supporting element 12 may be the same as or different from the material of the lid 14.

The semiconductor device 11 is disposed on the upper surface 10a of the substrate 10. The semiconductor device 11 includes a conductive wire 111 electrically connected to the substrate 10. The substrate 10 and the supporting element 12 define a space (S'). The substrate 10 and the transparent plate 13 define the space (S'). The substrate 10, the supporting element 12, and the transparent plate 13 define the space (S'). The substrate 10, the supporting element 12, the adhesive 15, and the transparent plate 13 define the space (S'). The semiconductor device 11 is disposed in the space (S').

The transparent plate 13 has the upper surface 13a and a lower surface 13b opposite to the upper surface 13a. A filter layer (not denoted in FIG. 1B) may be applied to cover the upper surface 13a or the lower surface 13b of the transparent plate 13 to mitigate against light leakage that adversely impacts detection sensitivity (e.g. of the semiconductor device 11). The filter layer may cover both the upper surface 13a and the lower surface 13b of the transparent plate 13. The transparent plate 13 is disposed on a stepped recess of the supporting element 12. The transparent plate 13 is disposed in the accommodating space (S). The transparent plate 13 is secured to the supporting element 12 via the adhesive 15. The adhesive 15 disposed between the supporting element 12 and the transparent plate 13 discontinuously surrounds the semiconductor device 11 (e.g. surrounds a portion of the semiconductor device 11).

The adhesive 15 defines the gap (G). At a portion corresponding to the gap (G), the transparent plate 13 is separated from the supporting element 12. The transparent plate 13 and the supporting element 12 define a channel (C). The lower surface 13b of the transparent plate 13 and the supporting element 12 define the channel (C). The transparent plate 13 and the lid 14 define the channel (C). The supporting element 12 and the adhesive 15 define the channel (C). The transparent plate 13 and the adhesive 15 define the channel (C). The supporting element 12 and the lid 14 define the channel (C). The supporting element 12, the adhesive layer 15', and the lid 14 define the channel (C). The supporting element 12, the adhesive 15, and the lid 14 define the channel (C). The supporting element 12, the transparent plate 13, and the lid 14 define the channel (C). The supporting element 12, the transparent plate 13, the adhesive 15, and the lid 14 define the channel (C). The supporting element 12, the transparent plate 13, the adhesive layer 15', and the lid 14 define the channel (C). The supporting element 12, the transparent plate 13, the adhesive 15, the adhesive layer 15', and the lid 14 define the channel (C). The channel (C) is in fluid/air communication with the space (S'). The channel (C) may be used as an air venting channel to release vapor or moisture. The channel (C) may include a winding or tortuous path. The channel (C) can mitigate light, water, and particle leakage. The gap (G) may constitute at least a portion of the channel (C). It is contemplated that the gap (G) may be additionally or alternatively provided at other locations. The channel (C) can help to prevent detachment of the lid 14 due to a pop-corn effect during a thermal cycle in an operation of manufacturing the semiconductor device package.

Figure 1C:
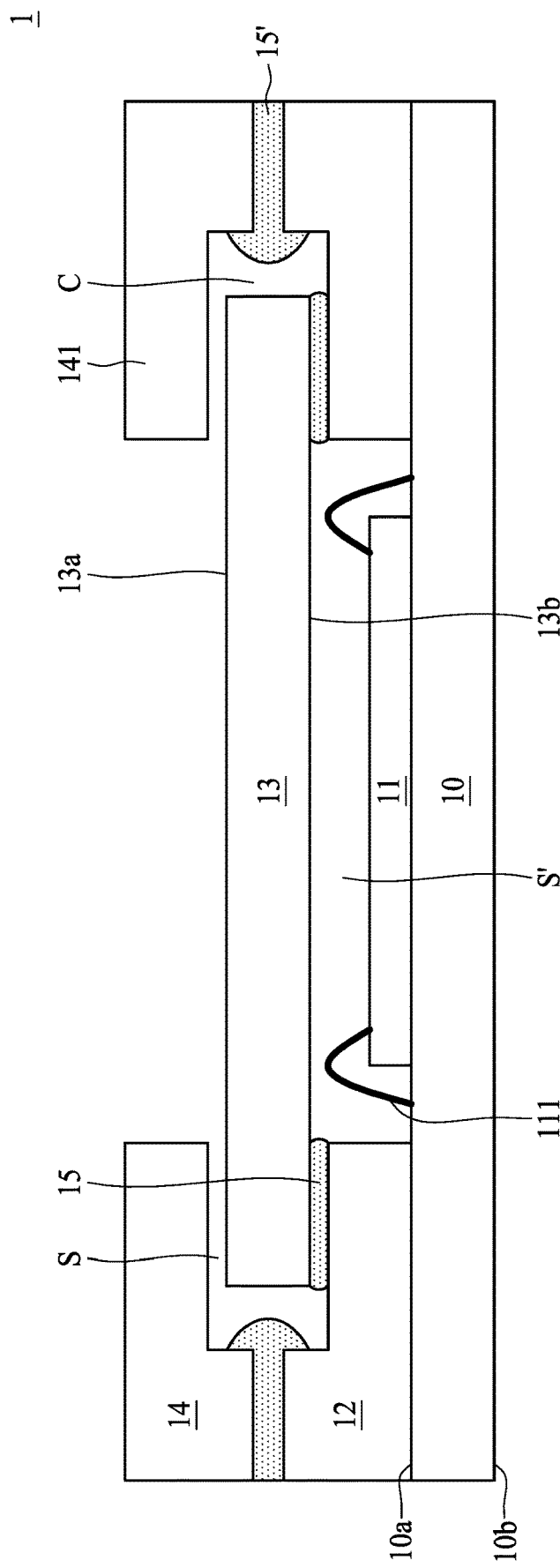
FIG. 1C illustrates a cross-sectional view of a semiconductor device package according to some embodiments of the present disclosure.

FIG. 1C is a cross-sectional view of a semiconductor device package 1 across line X-X in FIG. 1A according to some embodiments of the present disclosure. The adhesive 15 is disposed between the supporting element 12 and the transparent plate 13. The adhesive 15 surrounds the semiconductor device 11 (e.g. is disposed on opposing sides of the semiconductor device 11).

Figure 2:
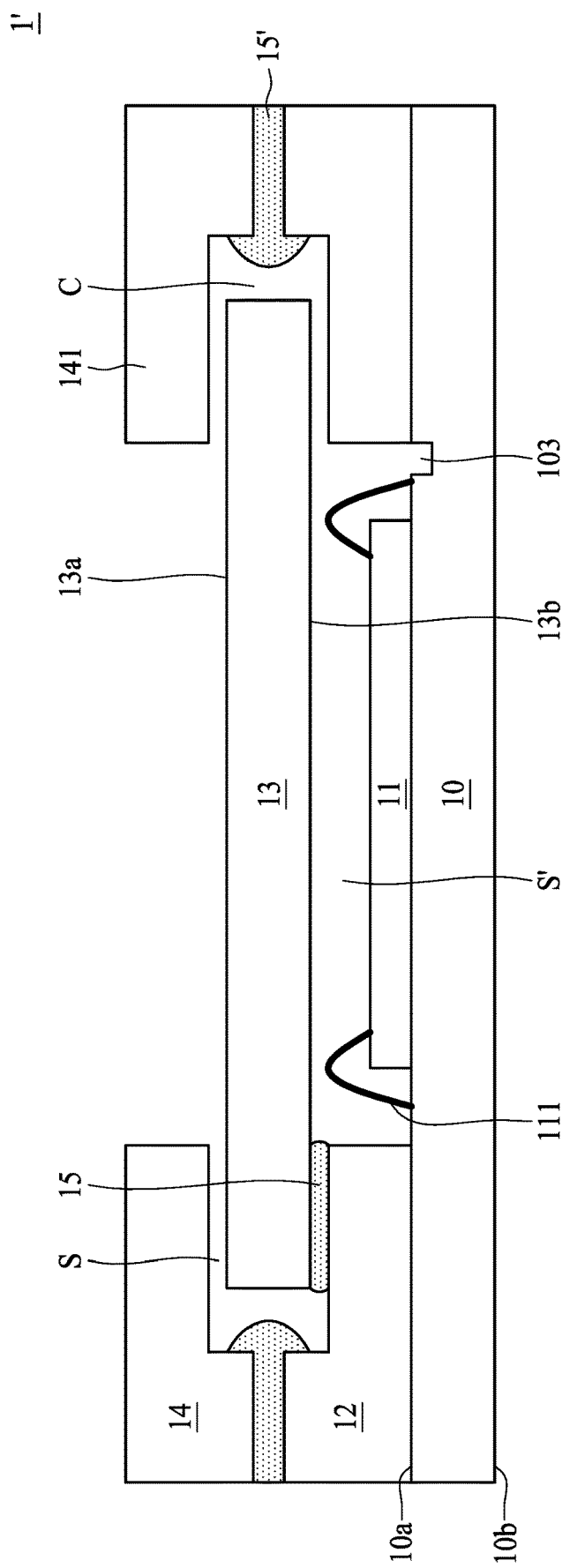
FIG. 2 illustrates a cross-sectional view of a semiconductor device package according to some embodiments of the present disclosure.

FIG. 2 is a cross-sectional view of a semiconductor device package 1' according to some embodiments of the present disclosure. The structure of FIG. 2 is similar to the structure of FIG. 1B except that the substrate 10 defines a recess 103. The recess 103 is disposed adjacent to an inner side surface of the supporting element 12.

Figure 3:
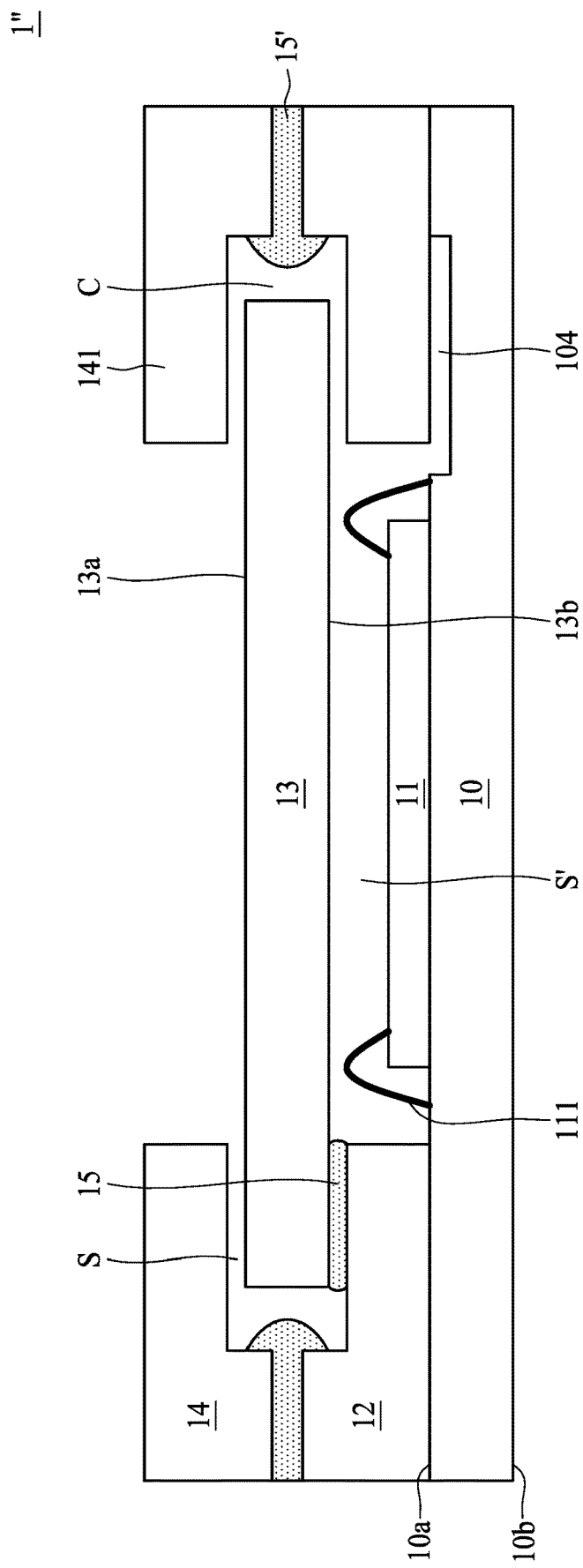
FIG. 3 illustrates a cross-sectional view of a semiconductor device package according to some embodiments of the present disclosure.

FIG. 3 is a cross-sectional view of a semiconductor device package 1" according to some embodiments of the present disclosure. The structure of FIG. 3 is similar to the structure of FIG. 1B except that the substrate 10 defines a recess 104. The recess 104 is disposed under a lower surface of the supporting element 12. The recess 104 may extend along an outer side surface of the substrate 10. The recess 104 may accommodate the adhesive layer 15', or may omit the adhesive layer 15'.

Figure 4:
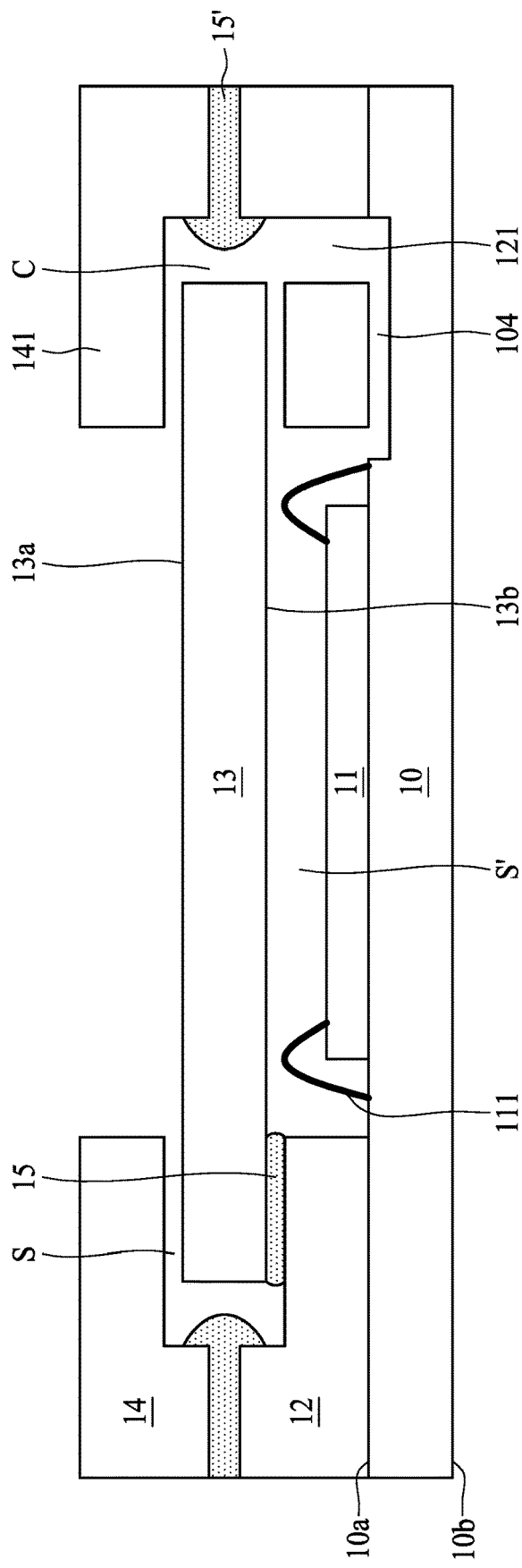
FIG. 4 illustrates a cross-sectional view of a semiconductor device package according to some embodiments of the present disclosure.

FIG. 4 is a cross-sectional view of a semiconductor device package 1''' according to some embodiments of the present disclosure. The structure of FIG. 4 is similar to the structure of FIG. 3 except that the supporting element 12 further includes a through via 121. The through via 121 (which can include, for example, a channel) communicates with the recess 104. The portion of the substrate 10 corresponding to the recess 104 and the portion of the support element 12 corresponding to the through via 121 omit the adhesive layer 15'. The substrate 10, the supporting element 12, the transparent plate 13, and the lid 14 define the channel (C). The channel (C) includes two winding or tortuous paths, and at least one such path can include the recess 104 and/or the through via 121. This can provide for the channel (C) releasing vapor or moisture more efficiently.

Figure 5:
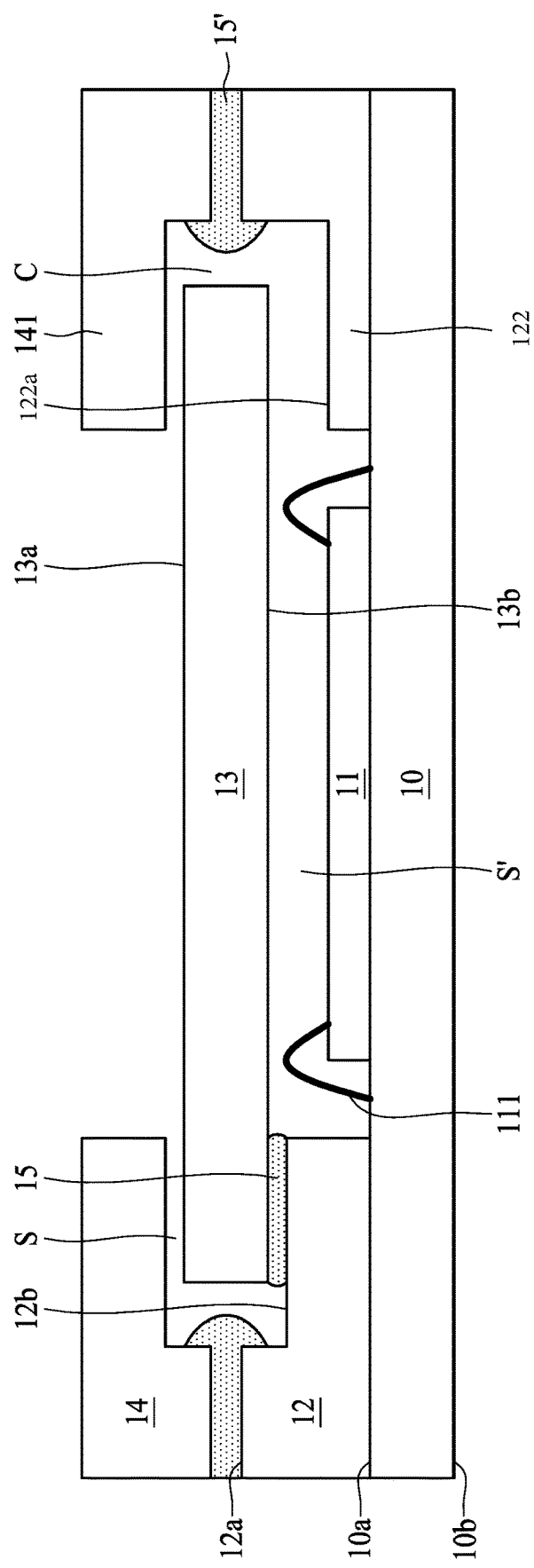
FIG. 5 illustrates a cross-sectional view of a semiconductor device package according to some embodiments of the present disclosure.

FIG. 5 is a cross-sectional view of a semiconductor device package 2 according to some embodiments of the present disclosure. The structure of FIG. 5 is similar to the structure of FIG. 1B except that the support element 12 further includes a recessed portion 122. The recessed portion 122 may be disposed under the gap (G). An edge of the adhesive 15 is adjacent to the recessed portion 122 (not shown). The support element 12 has a first upper surface 12a and a second upper surface 12b (e.g. respectively corresponding to a highest stepped portion and stepped portion of intermediary height). The recessed portion 122 has an upper surface 122a (e.g. corresponding to a lowest stepped portion). The upper surface 122a of the recessed portion 122 is lower than the second upper surface 12b of the support element 12 (e.g. a ratio of a distance between the top surface 10a of the substrate 10 and the second upper surface 12b of the support element 12 and a distance between the top surface 10a of the substrate 10 and the upper surface 122a of the recessed portion 122 is about 1.3 or more, about 1.6 or more, about 1.9 or more, about 2.2 or more, or about 2.5 or more). After securing the transparent plate 13 to the support element 12 via the adhesive 15, bleeding of the adhesive 15 can flow to the recessed portion 122 of the support element 12, and the larger width of the channel (C) at a portion of the channel corresponding to the recessed portion 122 can accommodate at least a portion of the bleeding adhesive 15 and still maintain a space between the transparent plate 13 and the recessed portion 122.

The vertical distance between the upper surface 122a of the recessed portion 122 and the second upper surface 12b of the supporting element 12 may be ranged from about 40 µm to about 60 µm.

Figure 6A:
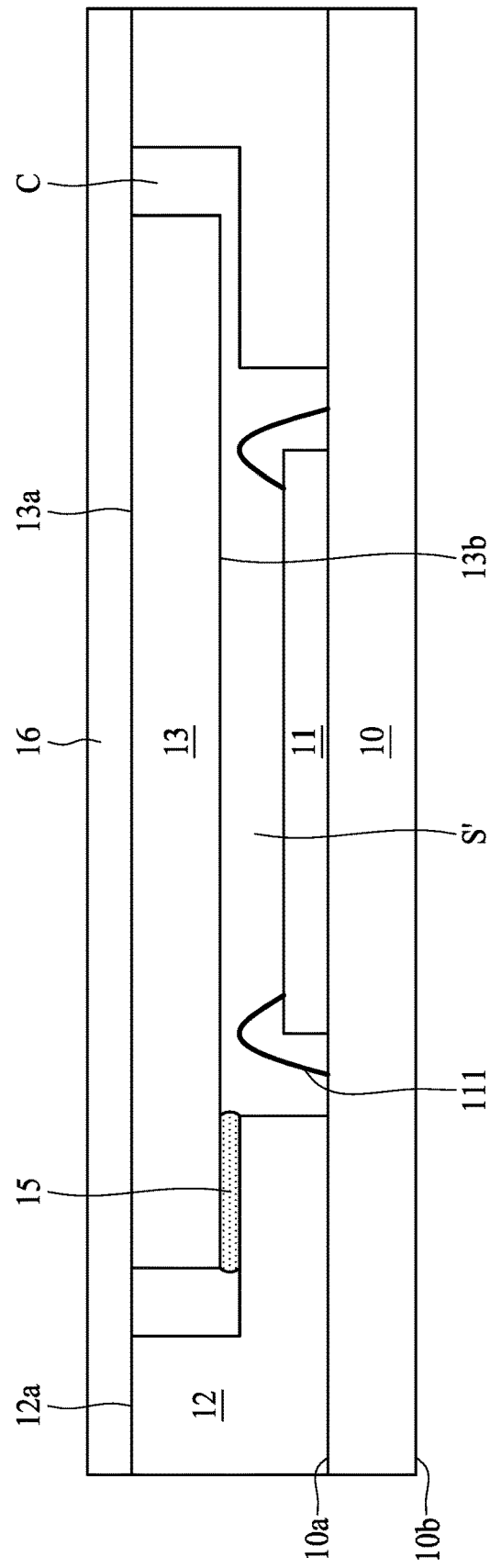
FIG. 6A illustrates a cross-sectional view of a semiconductor device package according to some embodiments of the present disclosure.

FIG. 6A is a cross-sectional view of a semiconductor device package 3 according to some embodiments of the present disclosure. The structure of FIG. 6A is similar to the structure of FIG. 1B except that the lid 14 and the adhesive layer 15' are omitted and the upper surface 12a of the support element 12 is substantially coplanar with the upper surface 13a of the transparent plate 13. The support element 12 is a lid. The support element 12 and the transparent plate 13 define the channel (C). The support element 12 includes an opaque material.

In some embodiments, an adhesive layer 16 or a tape 16 may be disposed on the upper surface 12a of the support element 12 and the upper surface 13a of the transparent plate 13. The tape 16 may protect the transparent plate 13 and help to avoid damage or contamination of the upper surface 13a of the transparent plate 13. The tape 16 may be removed after a singulation operation. The tape 16 may also be applied to other embodiments of the present disclosure.

Figure 6B:
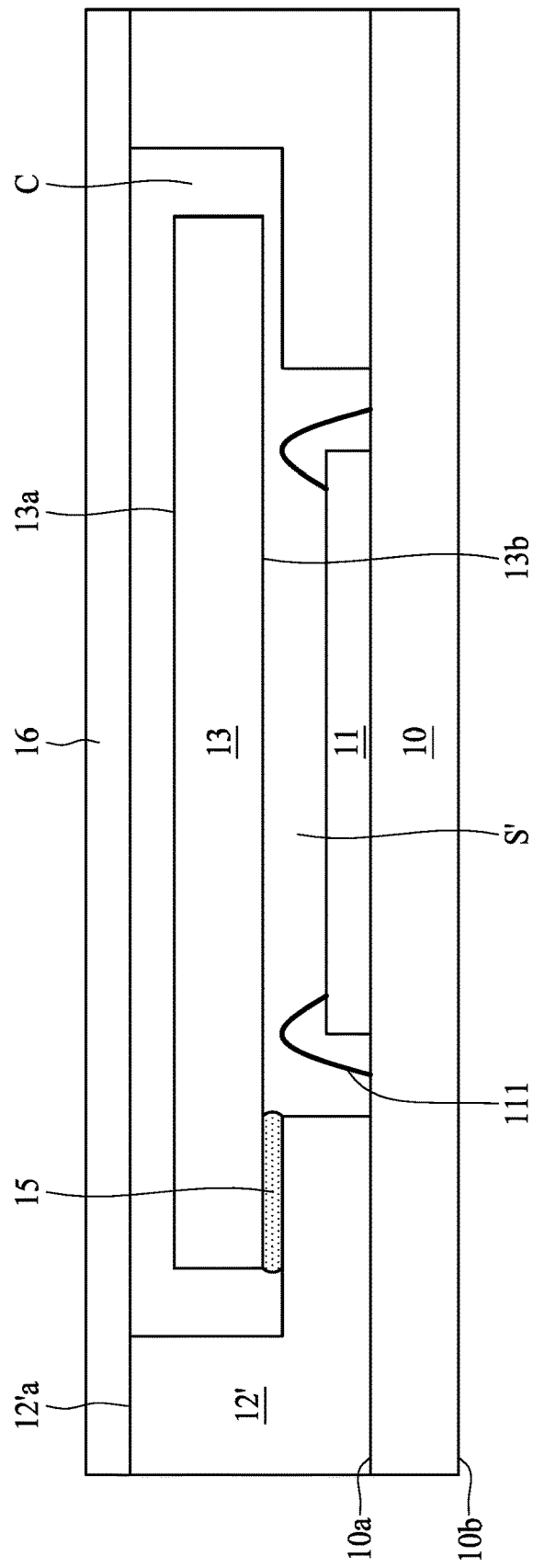
FIG. 6B illustrates a cross-sectional view of a semiconductor device package according to some embodiments of the present disclosure.

FIG. 6B is a cross-sectional view of a semiconductor device package 3' according to some embodiments of the present disclosure. The semiconductor device package 3' of FIG. 6B is similar to the semiconductor device package 3 of FIG. 6A except that a height or thickness of a support element 12' is greater than that of the support element 12. An upper surface 12'a of the support element 12' is higher than the upper surface 13a of the transparent plate 13 (e.g. the upper surface 12'a of the support element 12' is not coplanar with the upper surface 13a of the transparent plate 13). The tape 16 is spaced from the transparent plate 13. The tape 16 is not in contact with the transparent plate 13. No residual material of the tape 16 is disposed on the upper surface 13*a* of the transparent plate 13 subsequent to the removal of the tape 16.

Figure 7:
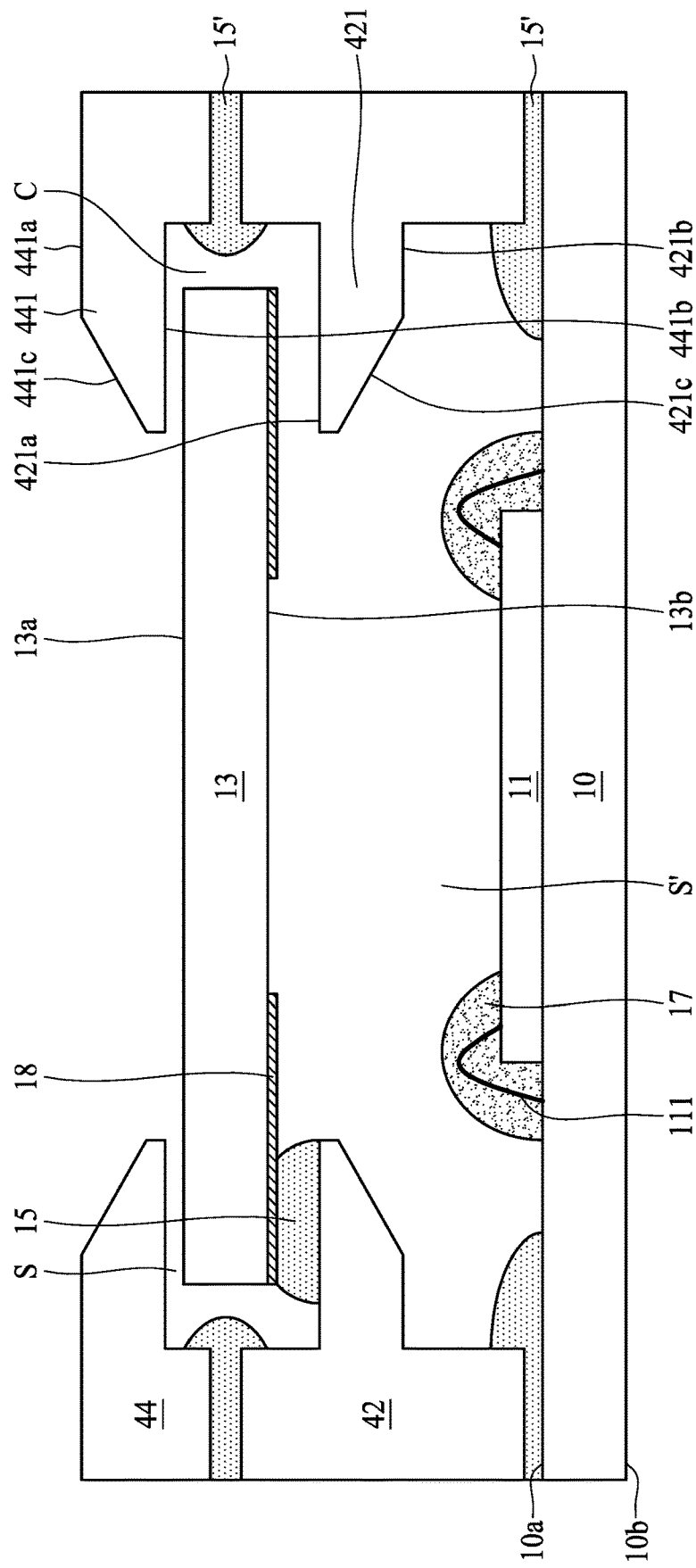
FIG. 7 illustrates a cross-sectional view of a semiconductor device package according to some embodiments of the present disclosure.

FIG. 7 is a cross-sectional view of a semiconductor device package 4 in accordance with some embodiments of the present disclosure. The semiconductor device package 4 of FIG. 7 is similar to the semiconductor device package 1 of FIG. 1B, except that the semiconductor device package 4 includes an opaque encapsulant 17, an opaque film 18, a supporting element 42 including an extension portion 421, and an extension portion 441 of a lid 44 having a side surface 441*c* with a slope.

The semiconductor device package 4 includes the substrate 10, the semiconductor device 11, the supporting element 42, the transparent plate 13, the adhesive 15, the adhesive layer 15', and the lid 44. The supporting element 42 may be a lid.

The conductive wire 111 of the semiconductor device 11 is encapsulated by the opaque encapsulant 17. The opaque encapsulant 17 may be used as a wire black pattern to block incident light from reaching the conductive wire 111 so as to avoid the unwanted incident light reflecting to the semiconductor device 11. A size (e.g. thickness or diameter) of the opaque encapsulant 17 may be adjusted according to design specifications.

The supporting element 42 is disposed on the substrate 10 via the adhesive layer 15'. The supporting element 42 surrounds the semiconductor device 11. The supporting element 42 includes the extension portion 421. The extension portion 421 has an upper surface 421*a*, a lower surface 421*b*, and a side surface 421*c*. The side surface 421*c* has a slope (e.g. a slope relative to the upper surface 421*a* or the lower surface 421*b*). The slope of the side surface 421*c* may be a positive slope or a negative slope. The side surface 421*c* may be substantially planar along the slope. The extension portion 421 of the supporting element 42 may be used as a supporting stage or a carrier to support the transparent plate 13.

The transparent plate 13 is disposed on the upper surface 421*a* of the extension portion 421. The adhesive 15 is disposed between the transparent plate 13 and the extension portion 421. The opaque film 18 is disposed on the lower surface 13*b* of the transparent plate 13. The opaque film 18 is disposed on the periphery of the transparent plate 13 (e.g. covers a peripheral portion of a lower surface 13*b* of the transparent plate 13, the peripheral portion constituting about 20% or less of a total surface area of the lower surface 13*b* of the transparent plate 13, about 15% or less of the total surface area of the lower surface 13*b* of the transparent plate 13, about 10% or less of the total surface area of the lower surface 13*b* of the transparent plate 13, or less). The opaque film 18 may be used as a glass black pattern to block unwanted incident light passing through the transparent plate 13 to the conductive wire 111, which may result in noise being received by the semiconductor device 11. A material of the opaque film 18 may be the same as or different from the material of the opaque encapsulant 17. A size (e.g. thickness, length, or width) of the opaque film 18 may be adjusted according to design specifications. The substrate 10 and the transparent plate 13 define the space (S'). The substrate 10 and the supporting element 42 define the space (S'). The substrate 10, the supporting element 42, and the transparent plate 13 define the space (S'). The substrate 10, the supporting element 42, the adhesive 15, and the transparent plate 13 define the space (S').

The lid 44 is disposed on the supporting element 42 via the adhesive layer 15'. The lid 44 includes the extension portion 441. The extension portion 441 has an upper surface 441*a*, a lower surface 441*b*, and the side surface 441*c*. The side surface 441*c* extends between the upper surface 441*a* and the lower surface 441*b*. The side surface 441*c* has a slope. The slope of the side surface 441*c* may be a positive slope or a negative slope. The design of the side surface 441*c* of the extension portion 441 may readily reflect unwanted light so as to avoid the unwanted light passing through the transparent plate 13 and arriving at the semiconductor device 11. The lid 44 includes an opaque material. The supporting element 42 and the lid 44 define an accommodating space (S). The transparent plate 13 is disposed in the accommodating space (S). A material of the supporting element 42 may be the same as or different from the material of the lid 44.

The transparent plate 13 and the supporting element 42 define the channel (C). The lower surface 13*b* of the transparent plate 13 and the supporting element 42 define the channel (C). The transparent plate 13 and the lid 44 define the channel (C). The supporting element 42 and the adhesive 15 define the channel (C). The supporting element 42 and the lid 44 define the channel (C). The supporting element 42, the transparent plate 13, and the lid 44 define the channel (C). The supporting element 42, the transparent plate 13, and the adhesive 15 define the channel (C). The supporting element 42, the transparent plate 13, the adhesive 15, and the lid 44 define the channel (C). The supporting element 42, the transparent plate 13, the adhesive layer 15', and the lid 44 define the channel (C). The supporting element 42, the transparent plate 13, the adhesive 15, the adhesive layer 15', and the lid 44 define the channel (C). The channel (C) is in fluid/air communication with the space (S'). The channel (C) may be used as an air venting channel to release vapor or moisture. The channel (C) may include a winding or tortuous path.

Figure 8A:
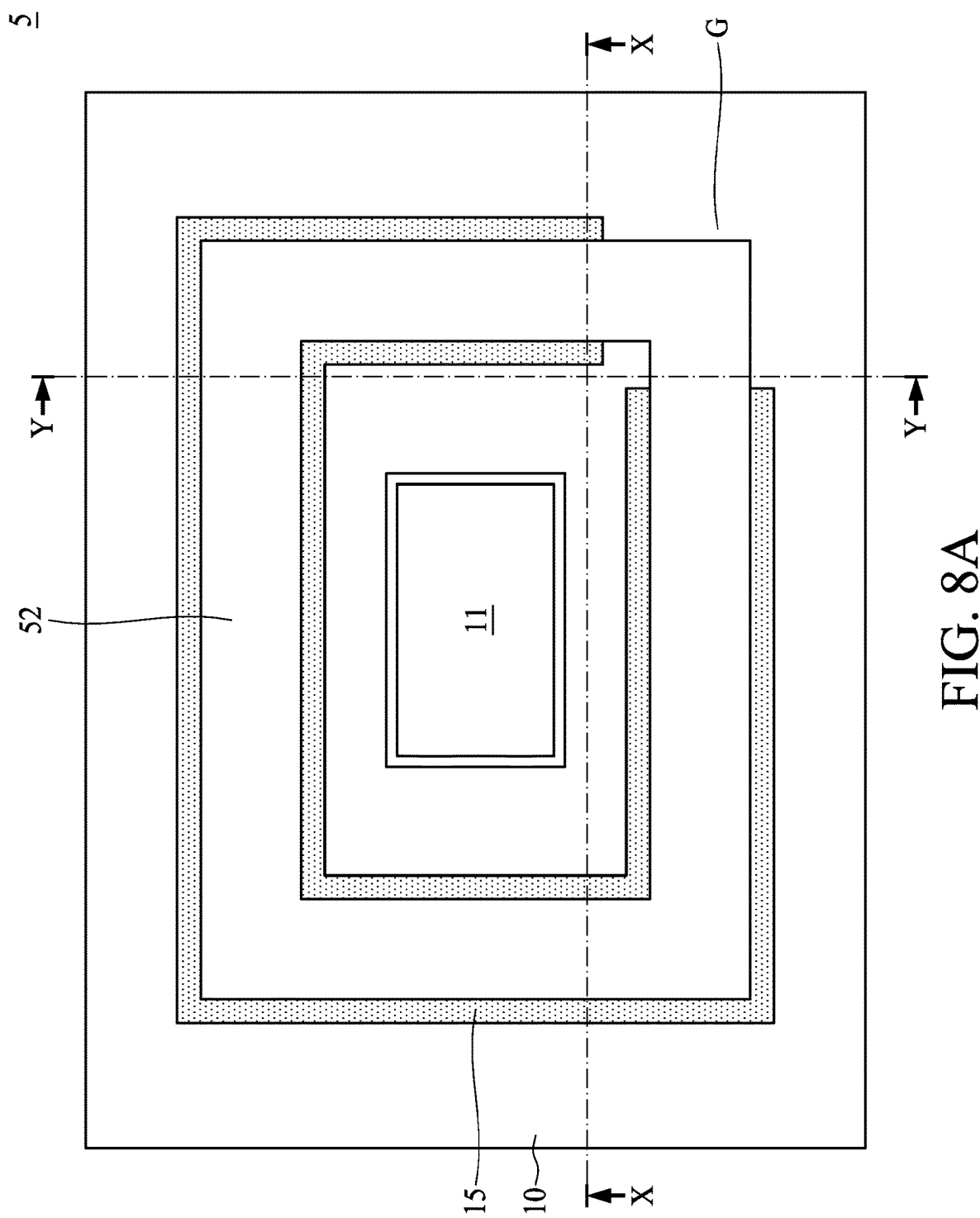
FIG. 8A illustrates a top view of a semiconductor device package according to some embodiments of the present disclosure.

FIG. 8A is a top view of a semiconductor device package 5 in accordance with some embodiments of the present disclosure. The semiconductor device package 5 includes a substrate 10, a semiconductor device 11, an adhesive 15, and a supporting element 52.

The adhesive 15 is disposed on the substrate 10. The semiconductor device 11 is disposed on the substrate 10. The supporting element 52 is disposed on the adhesive 15. The supporting element 52 defines an opening or a space to accommodate the semiconductor device 11. The supporting element 52 surrounds the semiconductor device 11. The semiconductor device 11 may include light emitting diodes (LEDs), optical sensors, pressure sensors, or other semiconductor devices. The semiconductor device 11 may include a flip-chip type semiconductor device. The semiconductor device 11 may include a wire-bond type semiconductor device.

The adhesive 15 discontinuously surrounds the semiconductor device 11 (e.g. surrounds a portion of semiconductor device 11). One end of the adhesive 15 is separated from another end of the adhesive 15 by a gap (G). In one or more embodiments, the adhesive 15 continuously surrounds a circumference of the semiconductor device 11 other than a portion of the circumference corresponding to the gap (G). In some embodiments, a bottom portion of the supporting element 52 corresponding to the gap (G) (e.g. adjacent to the gap (G)) may be a recess or depression of the supporting element 52. An edge of the adhesive 15 is adjacent to the recess. The depth of the recess of the supporting element 52 may be ranged from about 40 µm to about 60 µm. The supporting element 52 may include one or more bottom corners, and the gap (G) may be disposed adjacent to one or more of the bottom corners of the supporting element 52. The gap (G) may be disposed adjacent to any portion of the bottom of the supporting element 52.

Figure 8B:
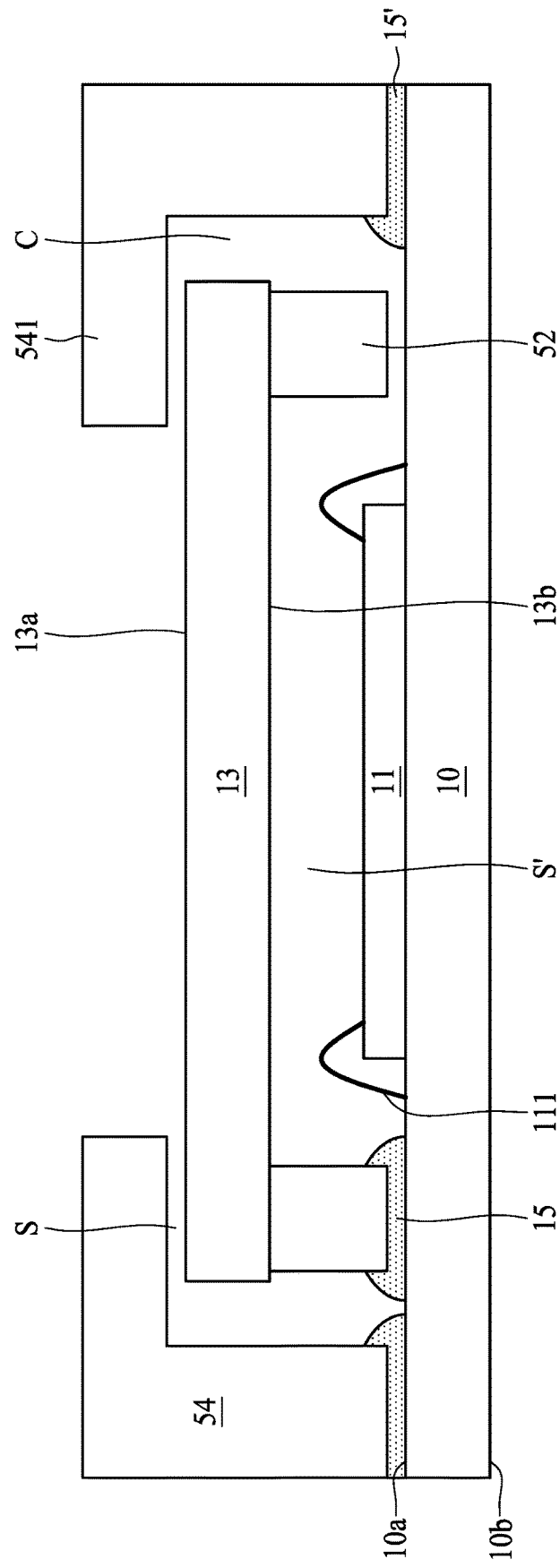
FIG. 8B illustrates a cross-sectional view of a semiconductor device package according to some embodiments of the present disclosure.

FIG. 8B is a cross-sectional view of a semiconductor device package 5 across line Y-Y in FIG. 8A in accordance with some embodiments of the present disclosure. The semiconductor device package 5 includes the substrate 10, the semiconductor device 11, the adhesive 15, an adhesive layer 15', the supporting element 52, a transparent plate/cover 13, and a lid 54.

The substrate 10 has an upper surface 10a and a lower surface 10b opposite to the upper surface 10a. The supporting element 52 is disposed on the upper surface 10a of the substrate 10. The supporting element 52 is secured to the substrate 10 via the adhesive 15. The supporting element 52 may be a dam or a lid. The supporting element 52 may include a solder mask, a photoresist, or other suitable materials. The adhesive 15 disposed between the substrate 10 and the supporting element 52 discontinuously surrounds the semiconductor device 11 (e.g. surrounds a portion of the semiconductor device 11). The lid 54 is disposed on the upper surface 10a of the substrate 10. The lid 54 is secured to the substrate 10 via the adhesive layer 15'. The lid 54 surrounds the semiconductor device 11. The lid 54 surrounds the supporting element 52. The lid 54 surrounds the transparent plate 13. The adhesive layer 15' between the substrate 10 and the lid 54 surrounds the semiconductor device 11. The adhesive layer 15' surrounds the supporting element 52. The lid 54 includes an opaque material. The lid 54 includes an extension portion 541. The extension portion 541 extends over at least a portion of the transparent plate 13. The extension portion 541 covers a periphery of the transparent plate 13 (e.g. covers a peripheral portion of an upper surface 13a of the transparent plate 13, the peripheral portion constituting about 20% or less of a total surface area of the upper surface 13a of the transparent plate 13, about 15% or less of the total surface area of the upper surface 13a of the transparent plate 13, about 10% or less of the total surface area of the upper surface 13a of the transparent plate 13, or less). The extension portion 541 mitigates against light leakage through side surfaces of the transparent plate 13. The supporting element 52 and the lid 54 define an accommodating space (S). A material of the supporting element 52 may be the same as or different from the material of the lid 54.

The semiconductor device 11 is disposed on the upper surface 10a of the substrate 10. The semiconductor device 11 includes a conductive wire 111 electrically connected to the substrate 10. The substrate 10 and the supporting element 52 define a space (S'). The substrate 10 and the transparent plate 13 define the space (S'). The substrate 10, the supporting element 52, and the transparent plate 13 define the space (S'). The semiconductor device 11 is disposed in the space (S').

The transparent plate 13 has the upper surface 13a and a lower surface 13b opposite to the upper surface 13a. A filter layer (not denoted in FIG. 8B) may be applied to cover the upper surface 13a or the lower surface 13b of the transparent plate 13 to mitigate against light leakage that adversely impacts detection sensitivity (e.g. of the semiconductor device 11). The filter layer may cover both the upper surface 13a and the lower surface 13b of the transparent plate 13. The transparent plate 13 is disposed on the supporting element 52. The transparent plate 13 is disposed in the accommodating space (S).

The adhesive 15 defines the gap (G). At a portion corresponding to the gap (G), the supporting element 52 is separated from the substrate 10. The substrate 10 and the supporting element 52 define the channel (C). The lower surface of the supporting element 52 and the substrate 10 define the channel (C). The supporting element 52 and the adhesive 15 define the channel (C). The transparent plate 13 and the adhesive 15 define the channel (C). The substrate 10 and the lid 54 define the channel (C). The supporting element 52 and the lid 54 define the channel (C). The transparent plate 13 and the lid 54 define the channel (C). The supporting element 52, the transparent plate 13, and the lid 54 define the channel (C). The substrate 10, the transparent plate 13, and the lid 54 define the channel (C). The supporting element 52, the adhesive 15, and the lid 54 define the channel (C). The substrate 10, the supporting element 52, the transparent plate 13, and the lid 54 define the channel (C). The substrate 10, the supporting element 52, the adhesive 15, the transparent plate 13, and the lid 54 define the channel (C). The substrate 10, the supporting element 52, the transparent plate 13, the adhesive layer 15', and the lid 54 define the channel (C). The substrate 10, the supporting element 52, the transparent plate 13, the adhesive 15, the adhesive layer 15', and the lid 54 define the channel (C). The channel (C) is in fluid/air communication with the space (S'). The channel (C) may be used as an air venting channel to release vapor or moisture. The channel (C) may include a winding or tortuous path. The channel (C) can mitigate light, water, and particle leakage. The gap (G) may constitute at least a portion of the channel (C). It is contemplated that the gap (G) may be additionally or alternatively provided at other locations. The channel (C) can help to prevent detachment of the lid 54 due to a pop-corn effect during a thermal cycle in an operation of manufacturing the semiconductor device package.

Figure 8C:
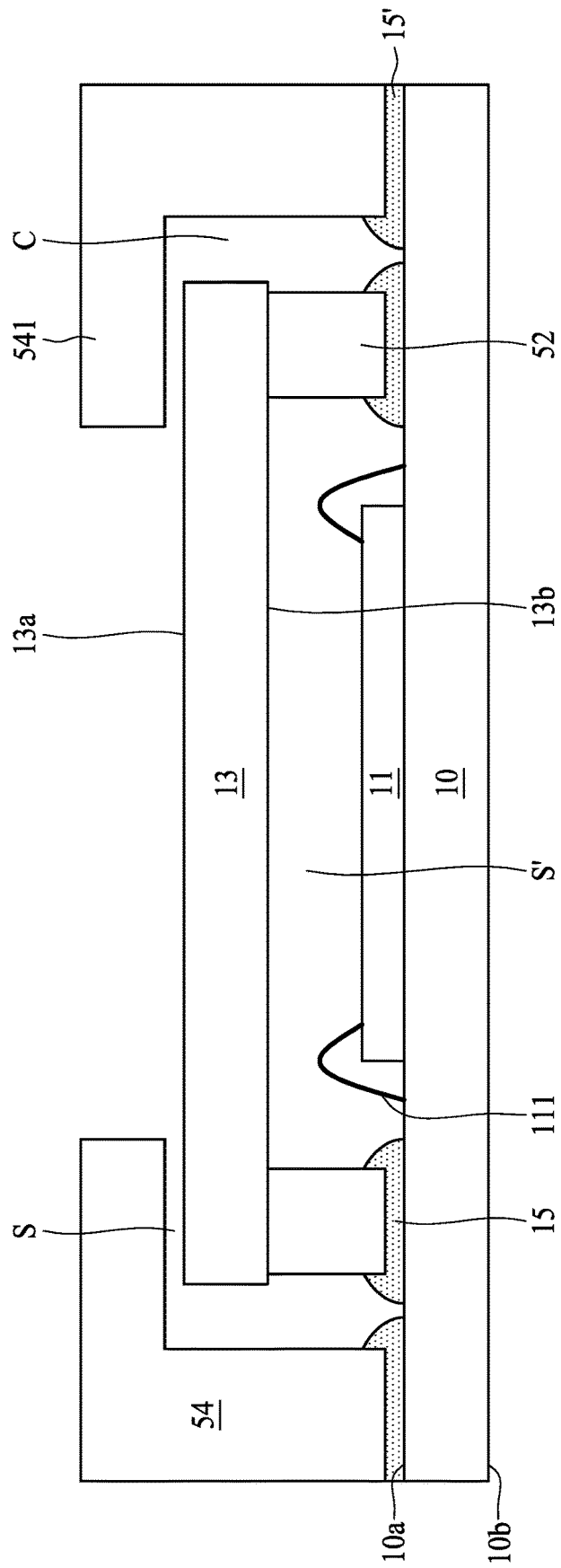
FIG. 8C illustrates a cross-sectional view of a semiconductor device package according to some embodiments of the present disclosure.

FIG. 8C is a cross-sectional view of a semiconductor device package 5 across line X-X in FIG. 8A according to some embodiments of the present disclosure. The adhesive 15 is disposed between the substrate 10 and the supporting element 52. The adhesive 15 surrounds the semiconductor device 11.

Figure 9:
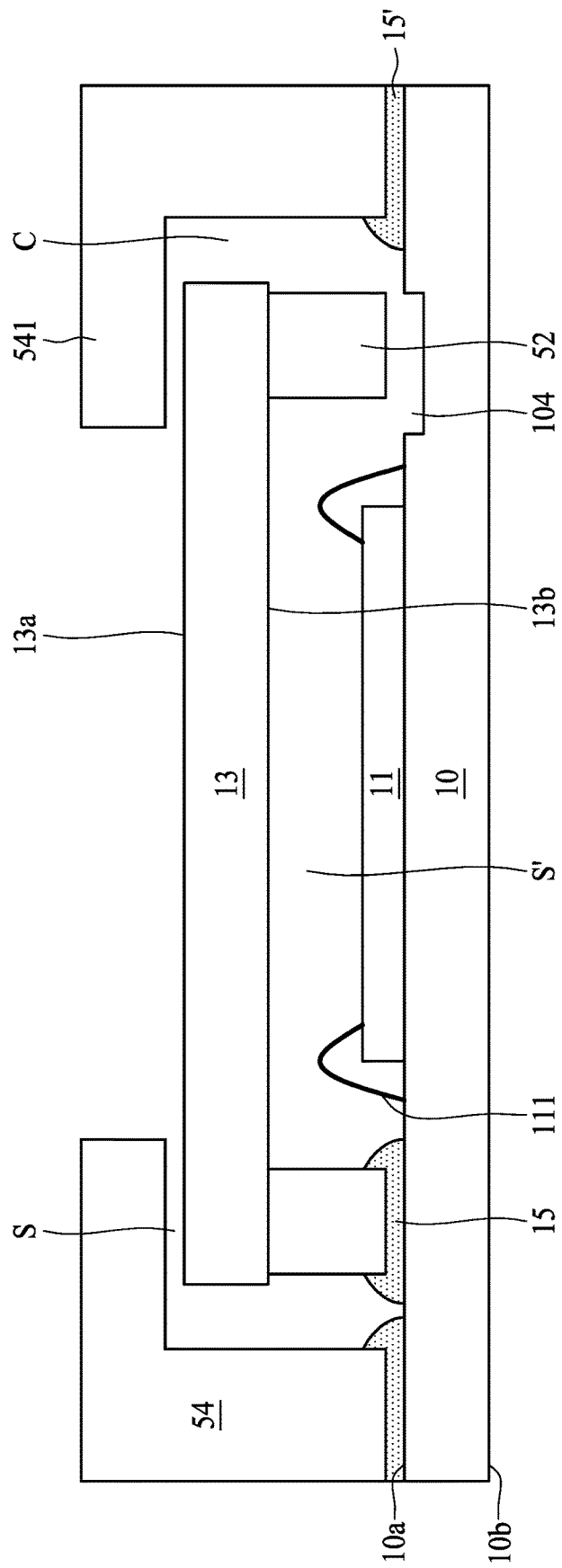
FIG. 9 illustrates a cross-sectional view of a semiconductor device package according to some embodiments of the present disclosure.

FIG. 9 is a cross-sectional view of a semiconductor device package 5' according to some embodiments of the present disclosure. The structure of FIG. 9 is similar to the structure of FIG. 8B except that the substrate 10 defines a recess 104. The recess 104 is disposed under a lower surface of the supporting element 52. The recess 104 may extend along an outer side surface of the substrate 10. A portion of the substrate 10 corresponding to the recess 104 may omit the adhesive layer 15', or may have the adhesive layer 15' disposed thereon.

Figure 10A:
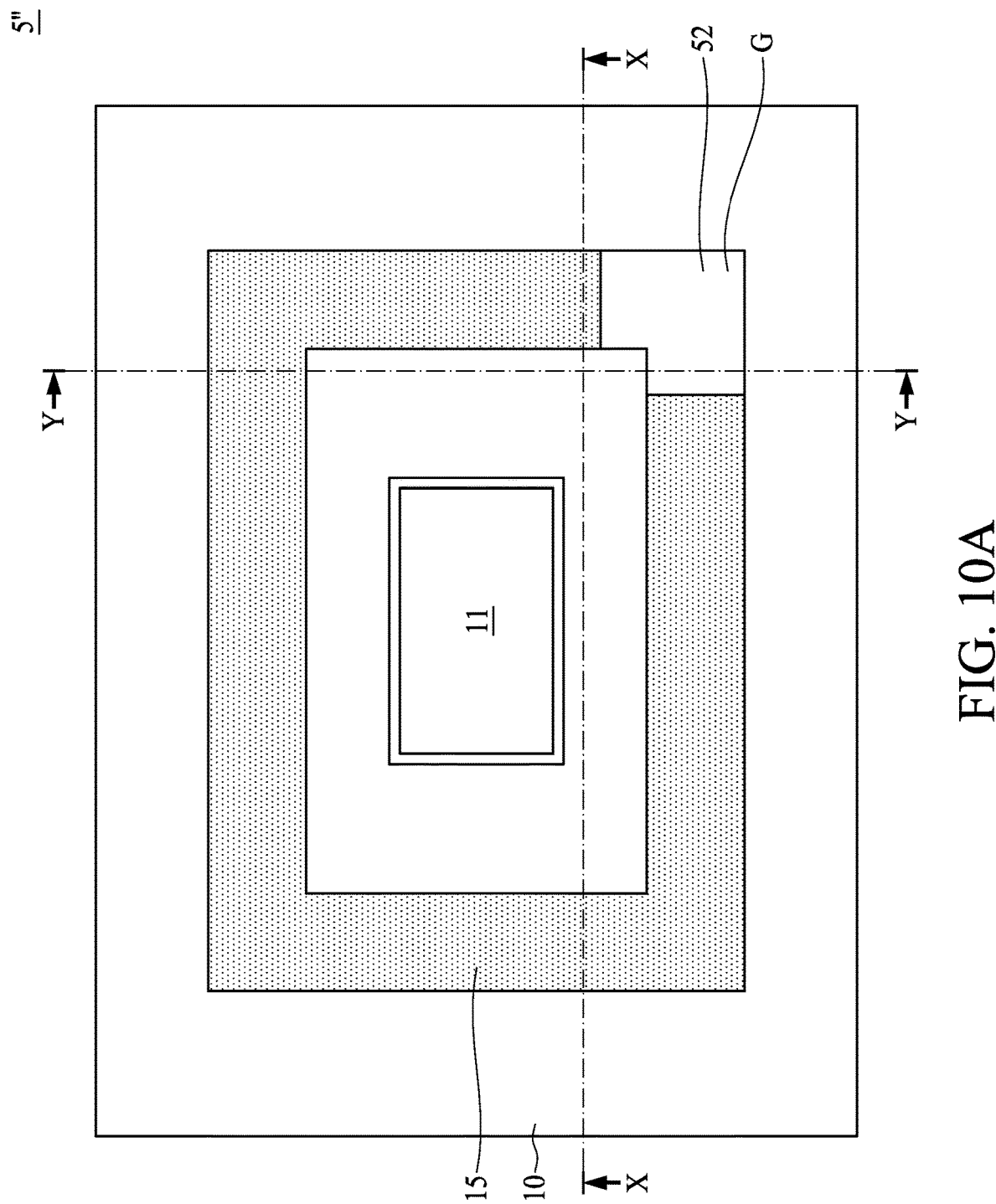
FIG. 10A illustrates a top view of a semiconductor device package according to some embodiments of the present disclosure.

FIG. 10A is a top view of a semiconductor device package 5" in accordance with some embodiments of the present disclosure. The semiconductor device package 5" includes a substrate 10, a semiconductor device 11, an adhesive 15, and a supporting element 52.

The adhesive 15 is disposed on the supporting element 52. The semiconductor device 11 is disposed on the substrate 10. The supporting element 52 is disposed on the substrate 10. The supporting element 52 defines an opening or a space to accommodate the semiconductor device 11. The supporting element 52 surrounds the semiconductor device 11. The semiconductor device 11 may include light emitting diodes (LEDs), optical sensors, pressure sensors, or other semiconductor devices. The semiconductor device 11 may include a flip-chip type semiconductor device. The semiconductor device 11 may include a wire-bond type semiconductor device.

The adhesive 15 discontinuously surrounds the semiconductor device 11 (e.g. surrounds a portion of semiconductor device 11). One end of the adhesive 15 is separated from another end of the adhesive 15 by a gap (G). In some embodiments, a bottom portion of the supporting element 52 corresponding to the gap (G) (e.g. adjacent to the gap (G) may be a recess or depression. An edge of the adhesive 15 is adjacent to the recess. The depth of the recess of the supporting element 52 may be ranged from about 40 μm to about 60 μm. The supporting element 52 may include one or more top corners, and the gap (G) may be disposed adjacent to one or more of the top corners of the supporting element 52. The gap (G) may be disposed adjacent to any portion of the top of the supporting element 52.

Figure 10B:
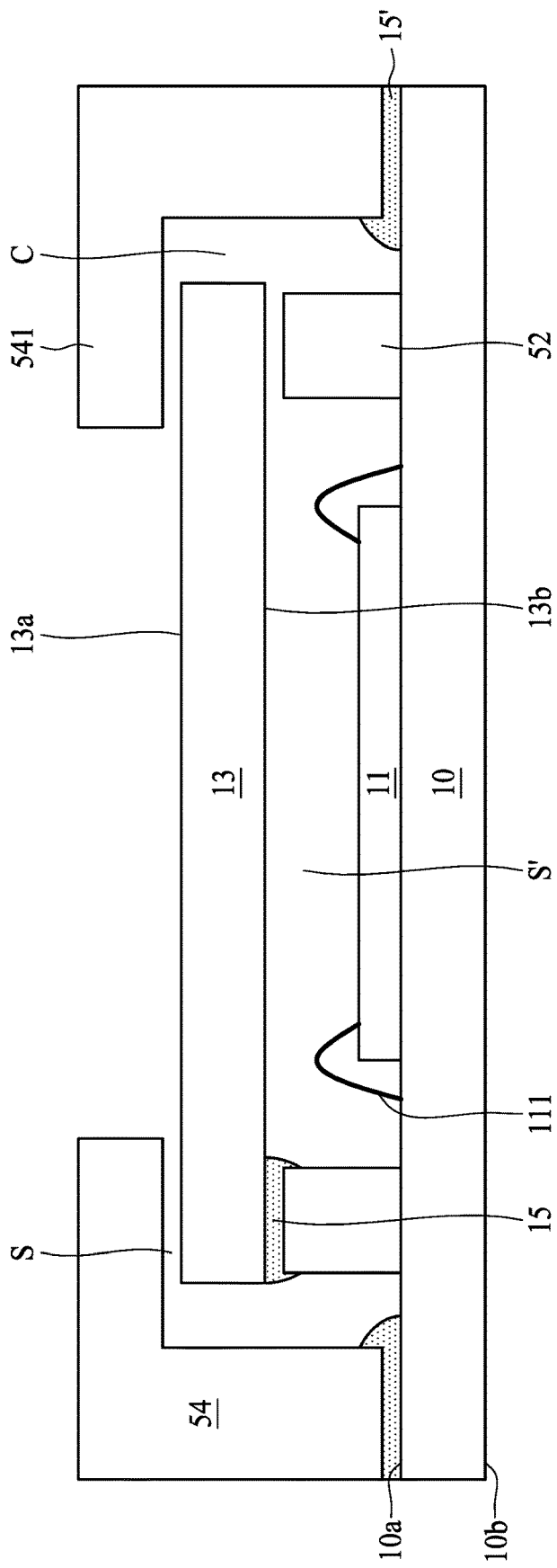
FIG. 10B illustrates a cross-sectional view of a semiconductor device package according to some embodiments of the present disclosure.

FIG. 10B is a cross-sectional view of a semiconductor device package 5" across line Y-Y in FIG. 10A in accordance with some embodiments of the present disclosure. The semiconductor device package 5" includes the substrate 10, the semiconductor device 11, the adhesive 15, an adhesive layer 15', the supporting element 52, a transparent plate/cover 13, and a lid 54.

The substrate 10 has an upper surface 10a and a lower surface 10b opposite to the upper surface 10a. The supporting element 52 is disposed on the upper surface 10a of the substrate 10. The supporting element 52 may be a dam or a lid. The supporting element 52 may include a solder mask, a photoresist, or other suitable materials. The lid 54 is disposed on the upper surface 10a of the substrate 10. The lid 54 is secured to the substrate 10 via the adhesive layer 15'. The lid 54 surrounds the semiconductor device 11. The lid 54 surrounds the supporting element 52. The lid 54 surrounds the transparent plate 13. The adhesive layer 15' disposed between the substrate 10 and the lid 54 surrounds the semiconductor device 11. The adhesive layer 15' surrounds the supporting element 52. The lid 54 includes an opaque material. The lid 54 includes an extension portion 541. The extension portion 541 extends over at least a portion of the transparent plate 13. The extension portion 541 covers a periphery of the transparent plate 13 (e.g. covers a peripheral portion of an upper surface 13a of the transparent plate 13, the peripheral portion constituting about 20% or less of a total surface area of the upper surface 13a of the transparent plate 13, about 15% or less of the total surface area of the upper surface 13a of the transparent plate 13, about 10% or less of the total surface area of the upper surface 13a of the transparent plate 13, or less). The extension portion 541 mitigates against light leakage through side surfaces of the transparent plate 13. The supporting element 52 and the lid 54 define an accommodating space (S). A material of the supporting element 52 may be the same as or different from the material of the lid 54.

The semiconductor device 11 is disposed on the upper surface 10a of the substrate 10. The semiconductor device 11 includes a conductive wire 111 electrically connected to the substrate 10. The substrate 10 and the supporting element 52 define a space (S'). The substrate 10 and the transparent plate 13 define the space (S'). The substrate 10, the supporting element 52, and the transparent plate 13 define the space (S'). The semiconductor device 11 is disposed in the space (S').

The transparent plate 13 has the upper surface 13a and a lower surface 13b opposite to the upper surface 13a. A filter layer (not denoted in FIG. 8B) may be applied to cover the upper surface 13a or the lower surface 13b of the transparent plate 13 to mitigate against light leakage that adversely impacts detection sensitivity (e.g. of the semiconductor device 11). The filter layer may cover both the upper surface 13a and the lower surface 13b of the transparent plate 13. The transparent plate 13 is disposed on the supporting element 52 via the adhesive 15. The transparent plate 13 is disposed in the accommodating space (S). The adhesive 15 disposed between the supporting element 52 and the transparent plate 13 discontinuously surrounds the semiconductor device 11 (e.g. surrounds a portion of semiconductor device 11).

The adhesive 15 defines the gap (G). At the portion corresponding to the gap (G), the supporting element 52 is separated from the transparent plate 13. The supporting element 52 and the transparent plate 13 define the channel (C). The lower surface of the supporting element 52 and the transparent plate 13 define the channel (C). The supporting element 52 and the lid 54 define the channel (C). The supporting element 52 and the adhesive 15 define the channel (C). The transparent plate 13 and the adhesive 15 define the channel (C). The transparent plate 13 and the lid 54 define the channel (C). The supporting element 52, the transparent plate 13, and the lid 54 define the channel (C). The transparent plate 13, the adhesive 15, and the lid 54 define the channel (C). The supporting element 52, the adhesive 15, and the transparent plate 13 define the channel (C). The supporting element 52, the adhesive 15, and the lid 54 define the channel (C). The supporting element 52, the transparent plate 13, the adhesive layer 15', and the lid 54 define the channel (C). The supporting element 52, the transparent plate 13, the adhesive 15, the adhesive layer 15', and the lid 54 define the channel (C). The channel (C) is in fluid/air communication with the space (S'). The channel (C) may be used as an air venting channel to release vapor or moisture. The channel (C) may include a winding or tortuous path. The channel (C) can mitigate light, water, and particle leakage. The gap (G) may constitute at least a portion of the channel (C). It is contemplated that the gap (G) may be additionally or alternatively provided at other locations. The channel (C) can help to prevent detachment of the lid 54 due to a pop-corn effect during a thermal cycle in an operation of manufacturing the semiconductor device package.

Figure 10C:
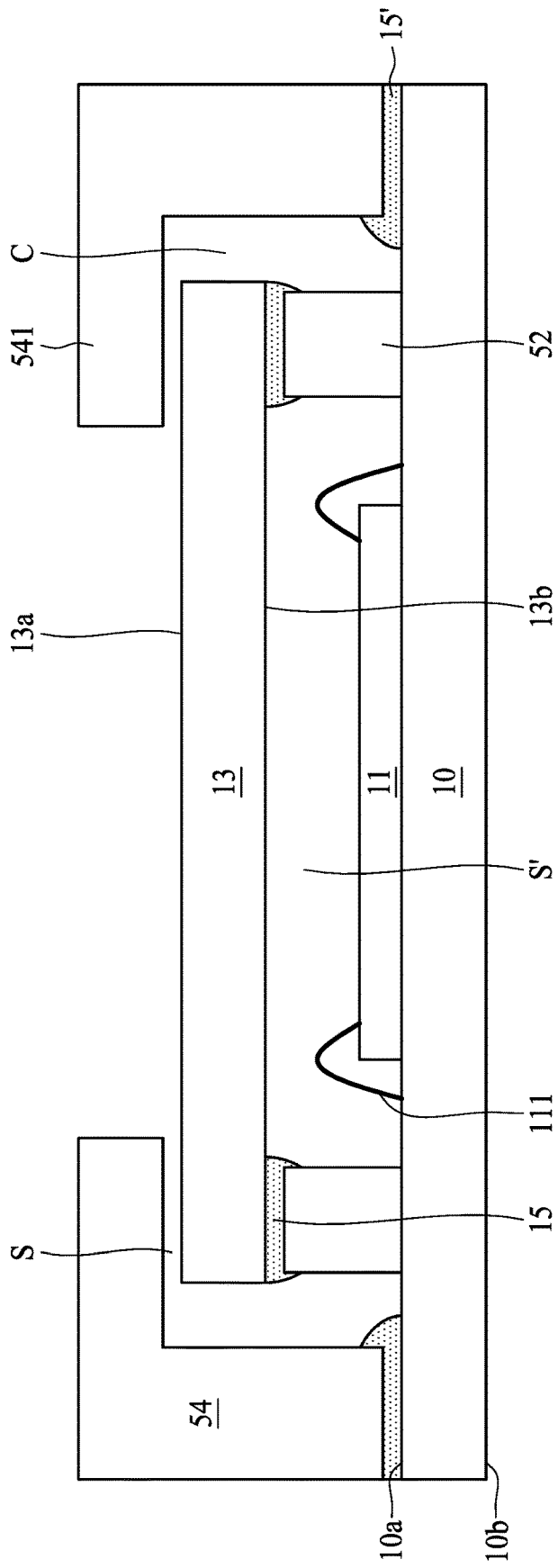
FIG. 10C illustrates a cross-sectional view of a semiconductor device package according to some embodiments of the present disclosure.

FIG. 10C is a cross-sectional view of a semiconductor device package 5" across line X-X in FIG. 10A according to some embodiments of the present disclosure. The adhesive 15 is disposed between the supporting element 52 and the transparent plate 13. The adhesive 15 surrounds the semiconductor device 11.

Figure 11:
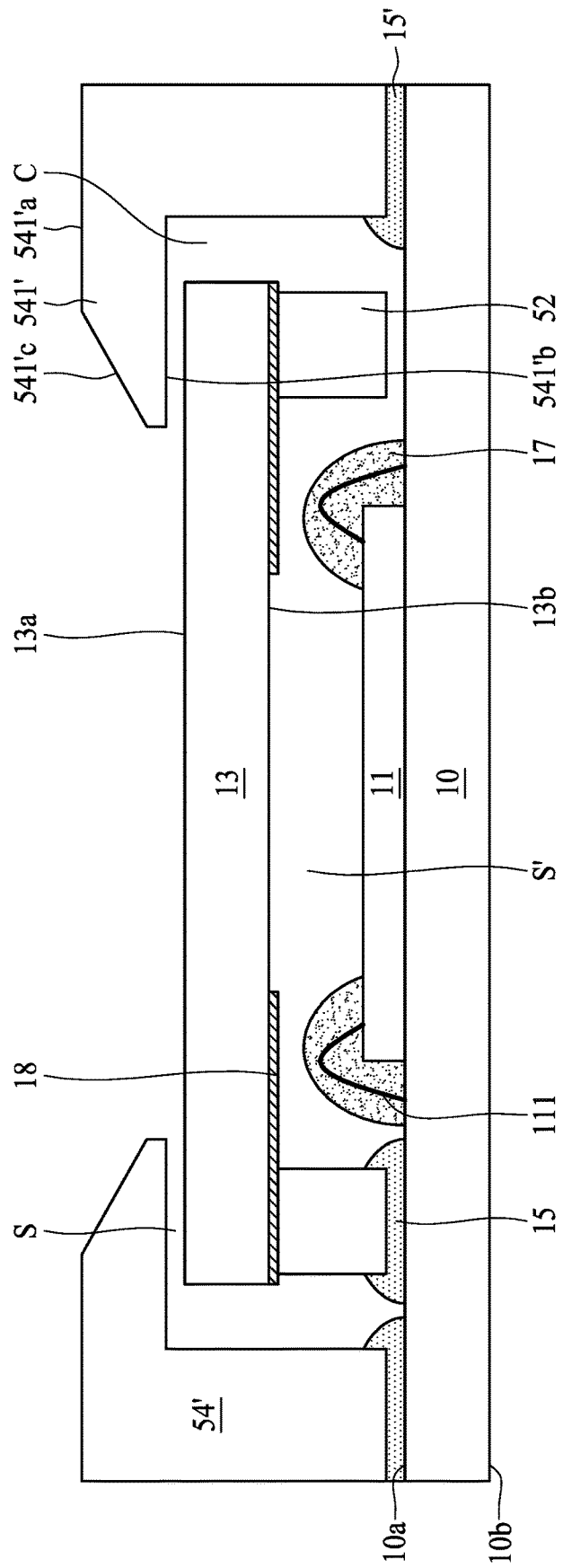
FIG. 11 illustrates a cross-sectional view of a semiconductor device package according to some embodiments of the present disclosure.

FIG. 11 is a cross-sectional view of a semiconductor device package 6 in accordance with some embodiments of the present disclosure. The semiconductor device package 6 of FIG. 11 is similar to the semiconductor device package 5 of FIG. 8B except that the semiconductor device package 6 includes an opaque encapsulant 17, an opaque film 18, and an extension portion 541' of a lid 54' having a side surface 541'c with a slope.

The semiconductor device package 6 includes the substrate 10, the semiconductor device 11 including the conductive wire 111, the supporting element 52, the transparent plate 13, the adhesive 15, the adhesive layer 15', and the lid 54'. The supporting element 52 may be a dam or a lid.

The conductive wire 111 of the semiconductor device 11 is encapsulated by the opaque encapsulant 17. The opaque encapsulant 17 may be used as a wire black pattern to block incident light from reaching the conductive wire 111 so as to avoid the unwanted incident light reflecting to the semiconductor device 11. A size (e.g. thickness or diameter) of the opaque encapsulant 17 may be adjusted according to design specifications.

The supporting element 52 is disposed on the substrate 10 via the adhesive 15. The supporting element 52 surrounds the semiconductor device 11.

The transparent plate 13 is disposed on the supporting element 52. The opaque film 18 is disposed on the lower surface 13b of the transparent plate 13. The opaque film 18 is disposed on the periphery of the transparent plate 13 (e.g. covers a peripheral portion of the lower surface 13b of the transparent plate 13, the peripheral portion constituting about 20% or less of a total surface area of the lower surface 13b of the transparent plate 13, about 15% or less of the total surface area of the lower surface 13b of the transparent plate 13, about 10% or less of the total surface area of the lower surface 13b of the transparent plate 13, or less). The opaque film 18 may be used as a glass black pattern to block unwanted incident light passing through the transparent plate 13 to the conductive wire 111, which may result in noise being received by the semiconductor device 11. The material of the opaque film 18 may be the same as or different from the material of the opaque encapsulant 17. A size (e.g. thickness, length, or width) of the opaque film 18 may be adjusted according to design specifications. The substrate 10 and the transparent plate 13 define the space (S'). The substrate 10 and the supporting element 52 define the space (S'). The substrate 10, the supporting element 52, and the transparent plate 13 define the space (S'). The substrate 10, the supporting element 52, the adhesive 15, and the transparent plate 13 define the space (S').

The lid 54' is disposed on the substrate 10 via the adhesive layer 15'. The lid 54' includes an extension portion 541'. The extension portion 541' has an upper surface 541'a, a lower surface 541'b, and the side surface 541'c. The side surface 541'c extends between the upper surface 541'a and the lower surface 541'b. The side surface 541'c has a slope (e.g. a slope relative to the upper surface 541'a or the lower surface 541'b). The slope of the side surface 541'c may be a positive slope or a negative slope. The side surface 541'c may be substantially planar along the slope. The design of the side surface 541'c of the extension portion 541' may readily reflect unwanted light so as to avoid the unwanted light passing through the transparent plate 13 and arriving at the semiconductor device 11. The lid 54' includes an opaque material. The supporting element 52 and the lid 54' define an accommodating space (S). The transparent plate 13 is disposed in the accommodating space (S). A material of the supporting element 52 may be the same as or different from the material of the lid 54'.

The transparent plate 13 and the supporting element 52 define the channel (C). The lower surface 13b of the transparent plate 13 and the supporting element 52 define the channel (C). The transparent plate 13 and the lid 54' define the channel (C). The supporting element 52 and the adhesive 15 define the channel (C). The supporting element 52 and the lid 54' define the channel (C). The supporting element 52, the transparent plate 13, and the lid 54' define the channel (C). The supporting element 52, the transparent plate 13, and the adhesive 15 define the channel (C). The supporting element 52, the transparent plate 13, the adhesive 15, and the lid 54' define the channel (C). The supporting element 52, the transparent plate 13, the adhesive layer 15', and the lid 54' define the channel (C). The supporting element 52, the transparent plate 13, the adhesive 15, the adhesive layer 15', and the lid 54' define the channel (C). The channel (C) is in fluid/air communication with the space (S'). The channel (C) may be used as an air venting channel to release vapor or moisture. The channel (C) may include a winding or tortuous path.

Figure 12A:
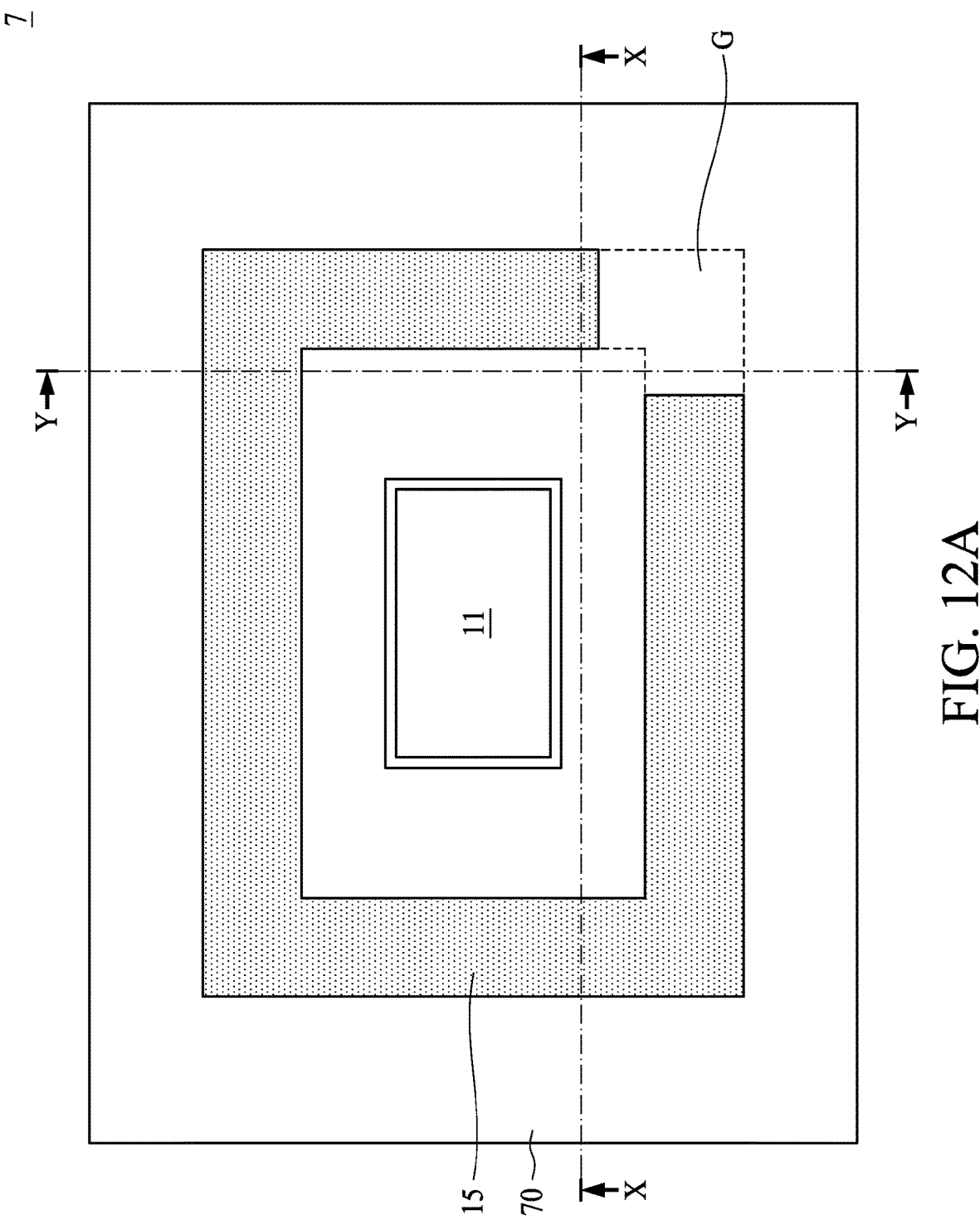
FIG. 12A illustrates a top view of a semiconductor device package according to some embodiments of the present disclosure.

FIG. 12A is a top view of a semiconductor device package 7 in accordance with some embodiments of the present disclosure. The semiconductor device package 7 includes a substrate 70, a semiconductor device 11, and an adhesive 15.

The substrate 70 may be a supporting element. The substrate 70 defines a cavity or a space to accommodate the semiconductor device 11. The adhesive 15 is disposed on the substrate 70. The adhesive 15 surrounds the cavity. The semiconductor device 11 is disposed on the substrate 70. The semiconductor device 11 is disposed in the cavity of the substrate 70. The semiconductor device 11 may include light emitting diodes (LEDs), optical sensors, pressure sensors, or other semiconductor devices. The semiconductor device 11 may include a flip-chip type semiconductor device. The semiconductor device 11 may include a wire-bond type semiconductor device.

The adhesive 15 discontinuously surrounds the semiconductor device 11 (e.g. surrounds a portion of the semiconductor device 11). One end of the adhesive 15 is separated from another end of the adhesive 15 by a gap (G). In some embodiments, a portion of the substrate 10 corresponding to the gap (G) (e.g. adjacent to the gap (G)) may be a recess or depression. An edge of the adhesive 15 is adjacent to the recess. The depth of the recess of the substrate 10 may be ranged from about 40 μm to about 60 μm. The depth of the recess of the substrate 10 is less than the depth of the cavity of the substrate 10. The cavity may have one or more corners, and the gap (G) may be disposed adjacent to one or more of the corners of the cavity. The gap (G) may be disposed adjacent to any portion of the periphery of the cavity.

Figure 12B:
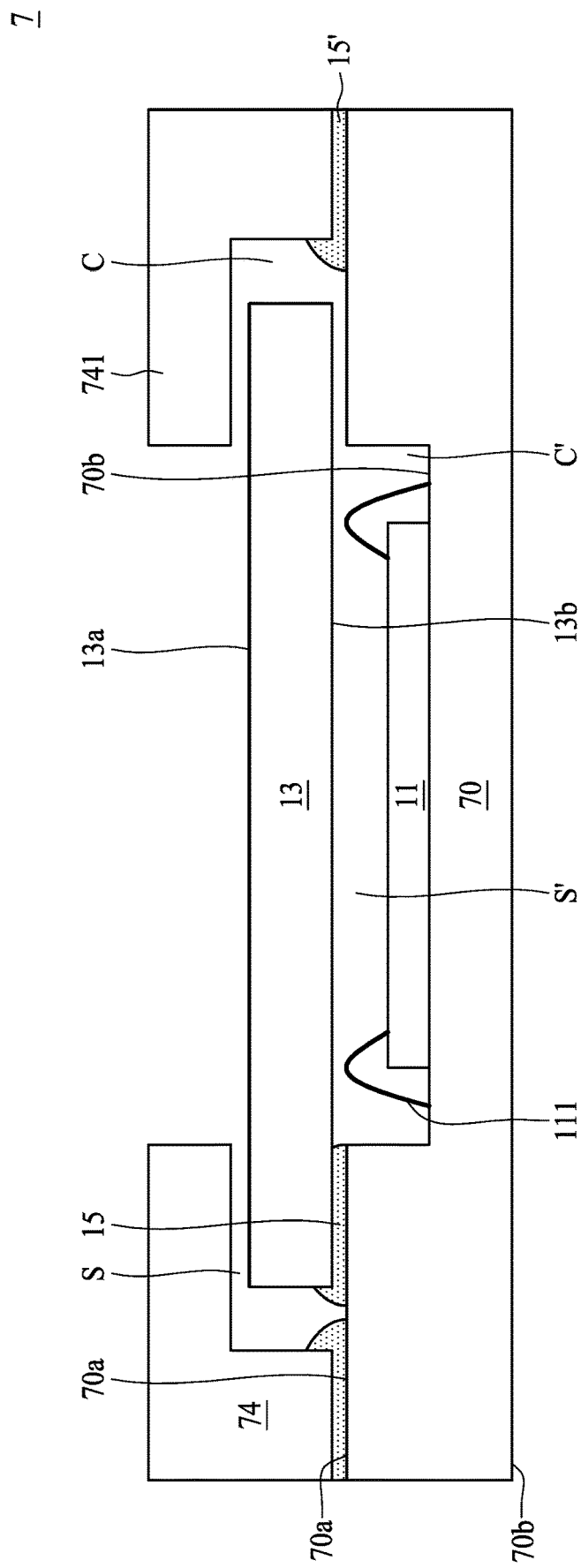
FIG. 12B illustrates a cross-sectional view of a semiconductor device package according to some embodiments of the present disclosure.

FIG. 12B is a cross-sectional view of a semiconductor device package 7 across line Y-Y in FIG. 12A in accordance with some embodiments of the present disclosure. The semiconductor device package 7 includes the substrate 70, the semiconductor device 11, the adhesive 15, an adhesive layer 15', a transparent plate/cover 13, and a lid 74.

The substrate 70 has an upper surface 70a and a lower surface 70b opposite to the upper surface 70a. The substrate 70 has a cavity (C'). The substrate 70 may be a supporting element. The lid 74 is disposed on the upper surface 70a of the substrate 70. The lid 74 is secured to the substrate 70 via the adhesive layer 15'. The lid 74 surrounds the semiconductor device 11. The lid 74 surrounds the transparent plate 13. The adhesive layer 15' disposed between the substrate 10 and the lid 74 surrounds the semiconductor device 11. The lid 74 includes an opaque material. The lid 74 includes an extension portion 741. The extension portion 741 extends over at least a portion of the transparent plate 13. The extension portion 741 covers a periphery of the transparent plate 13 (e.g. covers a peripheral portion of an upper surface 13a of the transparent plate 13, the peripheral portion constituting about 20% or less of a total surface area of the upper surface 13a of the transparent plate 13, about 15% or less of the total surface area of the upper surface 13a of the transparent plate 13, about 10% or less of the total surface area of the upper surface 13a of the transparent plate 13, or less). The extension portion 741 mitigates against light leakage through side surfaces of the transparent plate 13. The substrate 70 and the lid 74 define an accommodating space (S).

The semiconductor device 11 is disposed on the upper surface 70a of the substrate 70. The semiconductor device 11 is disposed in the cavity (C') of the substrate 70. The upper surface 70a of the substrate 70 may have a stepped shape. The semiconductor device 11 includes a conductive wire 111 electrically connected to the substrate 70. The substrate 70 and the transparent plate 13 define a space (S'). The substrate 70, the adhesive 15, and the transparent plate 13 define the space (S'). The semiconductor device 11 is disposed in the space (S').

The transparent plate 13 has the upper surface 13*a* and a lower surface 13*b* opposite to the upper surface 13*a*. A filter layer (not denoted in FIG. 12B) may be applied to cover the upper surface 13*a* or the lower surface 13*b* of the transparent plate 13 to mitigate against light leakage that adversely impacts detection sensitivity (e.g. of the semiconductor device 11). The filter layer may cover both the upper surface 13*a* and the lower surface 13*b* of the transparent plate 13. The transparent plate 13 is disposed on the upper surface 70*a* of the substrate 70 via the adhesive 15. The transparent plate 13 is disposed in the accommodating space (S). The adhesive 15 disposed between the substrate 70 and the transparent plate 13 discontinuously surrounds the semiconductor device 11 (e.g. surrounds a portion of the semiconductor device 11).

The adhesive 15 defines the gap (G). At a portion corresponding to the gap (G), the substrate 70 is separated from the transparent plate 13. The substrate 70 and the transparent plate 13 define the channel (C). The substrate 70 and the lower surface 13*b* of the transparent plate 13 define the channel (C). The substrate 70 and the adhesive 15 define the channel (C). The transparent plate 13 and the adhesive 15 define the channel (C). The substrate 70 and the lid 74 define the channel (C). The transparent plate 13 and the lid 74 define the channel (C). The substrate 70, the transparent plate 13, and the lid 74 define the channel (C). The transparent plate 13, the adhesive 15, and the lid 74 define the channel (C). The substrate 70, the adhesive 15, and the transparent plate 13 define the channel (C). The substrate 70, the adhesive 15, and the lid 74 define the channel (C). The substrate 70, the transparent plate 13, the adhesive layer 15', and the lid 74 define the channel (C). The substrate 70, the transparent plate 13, the adhesive 15, the adhesive layer 15', and the lid 74 define the channel (C). The channel (C) is in fluid/air communication with the space (S'). The channel (C) may be used as an air venting channel to release vapor or moisture. The channel (C) may include a winding or tortuous path. The channel (C) can mitigate light, water, and particle leakage. The gap (G) may constitute at least a portion of the channel (C). It is contemplated that the gap (G) may be additionally or alternatively provided at other locations. The channel (C) can help to prevent detachment of the lid 74 due to a pop-corn effect during a thermal cycle in an operation of manufacturing the semiconductor device package.

Figure 12C:
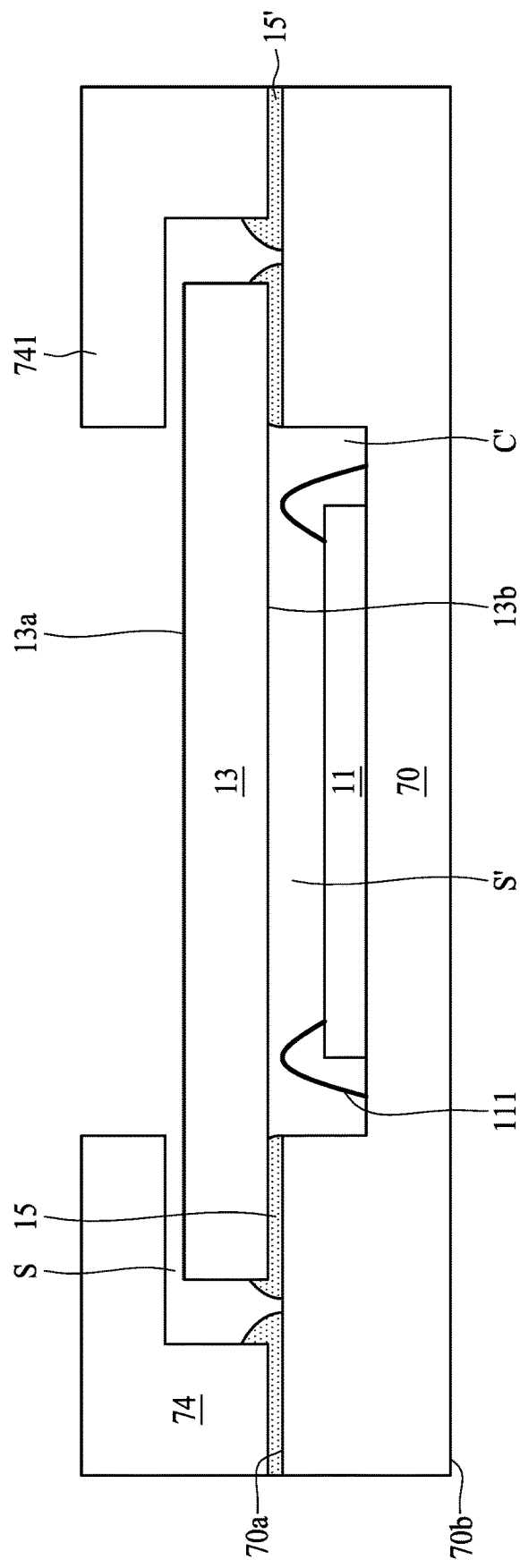
FIG. 12C illustrates a cross-sectional view of a semiconductor device package according to some embodiments of the present disclosure.

FIG. 12C is a cross-sectional view of a semiconductor device package 7 across line X-X in FIG. 12A according to some embodiments of the present disclosure. The adhesive 15 is disposed between the substrate 70 and the transparent plate 13. The adhesive 15 surrounds the semiconductor device 11.

Figure 13:
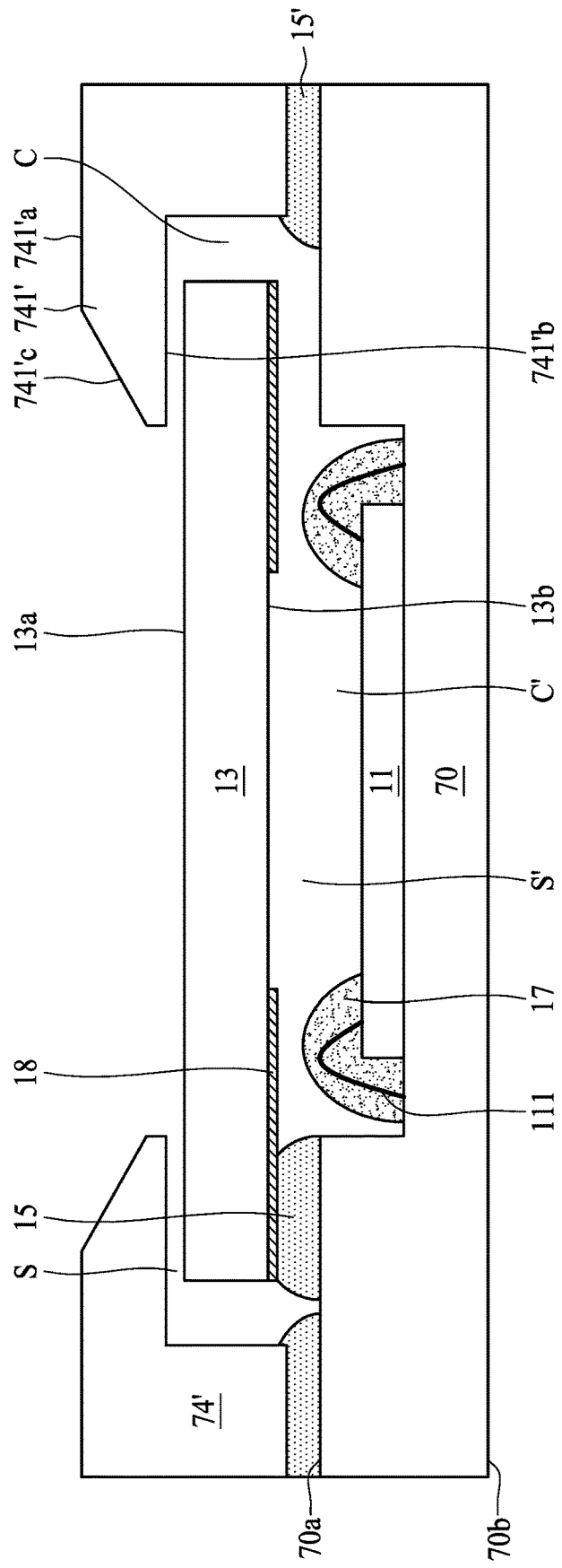
FIG. 13 illustrates a cross-sectional view of a semiconductor device package according to some embodiments of the present disclosure.

FIG. 13 is a cross-sectional view of a semiconductor device package 8 in accordance with some embodiments of the present disclosure. The semiconductor device package 8 of FIG. 13 is similar to the semiconductor device package 7 of FIG. 12B except that the semiconductor device package 8 includes an opaque encapsulant 17, an opaque film 18, and an extension portion 741' of a lid 74' having a side surface 741'*c* with a slope.

The semiconductor device package 8 includes the substrate 70, the semiconductor device 11, the transparent plate 13, the adhesive 15, the adhesive layer 15', and the lid 74'.

The conductive wire 111 of the semiconductor device 11 is encapsulated by the opaque encapsulant 17. The opaque encapsulant 17 may be used as a wire black pattern to block incident light from reaching the conductive wire 111 so as to avoid the unwanted incident light reflecting to the semiconductor device 11. A size (e.g. thickness or diameter) of the opaque encapsulant 17 may be adjusted according to design specifications.

The transparent plate 13 is disposed on the substrate 70. The opaque film 18 is disposed on the lower surface 13*b* of the transparent plate 13. The opaque film 18 is disposed on the periphery of the transparent plate 13 (e.g. covers a peripheral portion of the lower surface 13*b* of the transparent plate 13, the peripheral portion constituting about 20% or less of a total surface area of the lower surface 13*b* of the transparent plate 13, about 15% or less of the total surface area of the lower surface 13*b* of the transparent plate 13, about 10% or less of the total surface area of the lower surface 13*b* of the transparent plate 13, or less). The opaque film 18 may be used as a glass black pattern to block the unwanted incident light passing through the transparent plate 13 to the conductive wire 111 which may result in noise being received by the semiconductor device 11. A material of the opaque film 18 may be the same as or different from the material of the opaque encapsulant 17. A size (e.g. thickness, length, or width) of the opaque film 18 may be adjusted according to design specifications. The substrate 70 and the transparent plate 13 define the space (S'). The substrate 70 and the adhesive 15 define the space (S'). The substrate 70, the adhesive 15, and the transparent plate 13 define the space (S'). The substrate 10, the adhesive 15, and the transparent plate 13 define the space (S').

The lid 74' is disposed on the substrate 10 via the adhesive layer 15'. The lid 74' includes the extension portion 741'. The extension portion 741' has an upper surface 741'*a*, a lower surface 741'*b*, and the side surface 741'*c*. The side surface 741'*c* extends between the upper surface 741'*a* and the lower surface 741*b*. The side surface 741'*c* has a slope (e.g. a slope relative to the upper surface 741'*a* or the lower surface 741'*b*). The side surface 741'*c* may be substantially planar. The slope of the side surface 741'*c* may be a positive slope or a negative slope. The design of the side surface 741'*c* of the extension portion 741' may readily reflect unwanted light so as to avoid the unwanted light passing through the transparent plate 13 and arriving at the semiconductor device 11. The lid 74' includes an opaque material. The substrate 70 and the lid 74' define an accommodating space (S). The transparent plate 13 is disposed in the accommodating space (S).

The substrate 70 and the transparent plate 13 define the channel (C). The substrate 70 and the lower surface 13*b* of the transparent plate 13 define the channel (C). The substrate 70 and the adhesive 15 define the channel (C). The transparent plate 13 and the adhesive 15 define the channel (C). The substrate 70 and the lid 74' define the channel (C). The transparent plate 13 and the lid 74' define the channel (C). The substrate 70, the transparent plate 13, and the lid 74' define the channel (C). The transparent plate 13, the adhesive 15, and the lid 74' define the channel (C). The substrate 70, the adhesive 15, and the transparent plate 13 define the channel (C). The substrate 70, the adhesive 15, and the lid 74' define the channel (C). The substrate 70, the transparent plate 13, the adhesive layer 15', and the lid 74' define the channel (C). The substrate 70, the transparent plate 13, the adhesive 15, the adhesive layer 15', and the lid 74' define the channel (C). The channel (C) is in fluid/air communication with the space (S'). The channel (C) may be used as an air venting channel to release vapor or moisture. The channel (C) may include a winding or tortuous path.

Figure 14:
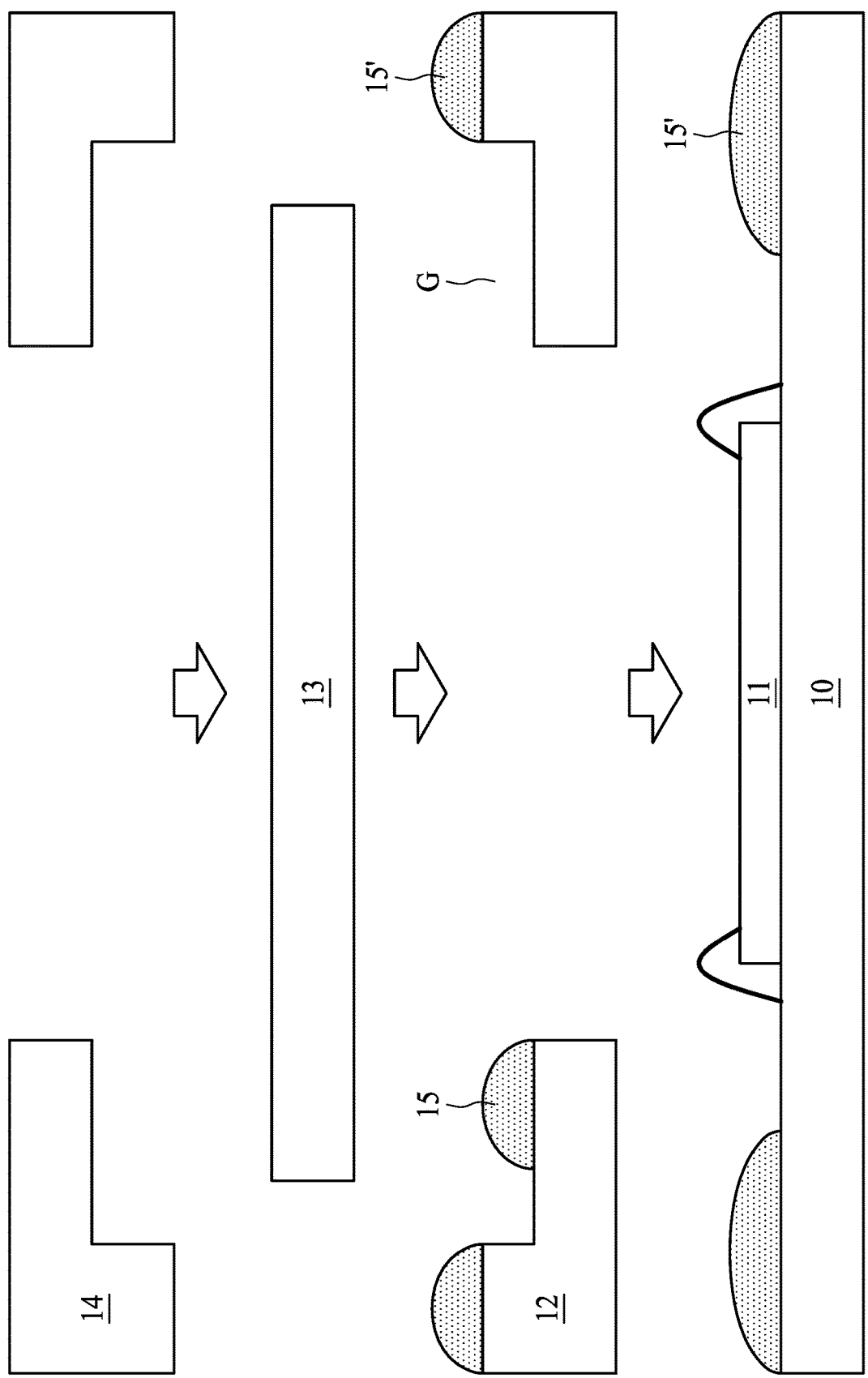
FIG. 14 illustrates a method of manufacturing a semiconductor device package according to some embodiments of the present disclosure.

FIG. 14 illustrates a method of manufacturing a semiconductor device package 1 according to some embodiments of the present disclosure. A semiconductor device 11 is bonded and wire bonded to a substrate 10. An adhesive layer 15' is applied to the substrate 10. A supporting element 12 is attached to the substrate 10. The supporting element 12 is secured to the substrate 10 via an adhesive layer 15'.

The adhesive layer 15' is applied to an outer periphery of the supporting element 12. The adhesive 15 is applied to an inner periphery of the supporting element 12. A transparent plate 13 is attached to the supporting element 12. The transparent plate 13 is secured to the supporting element 12 via the adhesive 15. A lid 14 is attached to the supporting element 12. The lid 14 is secured to the supporting element 12 via the adhesive layer 15'.

The adhesive 15 defines a gap (G). The adhesive 15 discontinuously surrounds the semiconductor device 11 (e.g. surrounds a portion of the semiconductor device 11). One end of the adhesive 15 is separated from another end of the adhesive 15 by the gap (G). At a portion corresponding to the gap (G), the supporting element 12 is separated from the transparent plate 13.

In some embodiments, a panel of semiconductor device packages 1 are singulated by a singulation operation. A strip sheet of semiconductor device packages 1 are singulated by a singulation operation.

Figure 15:
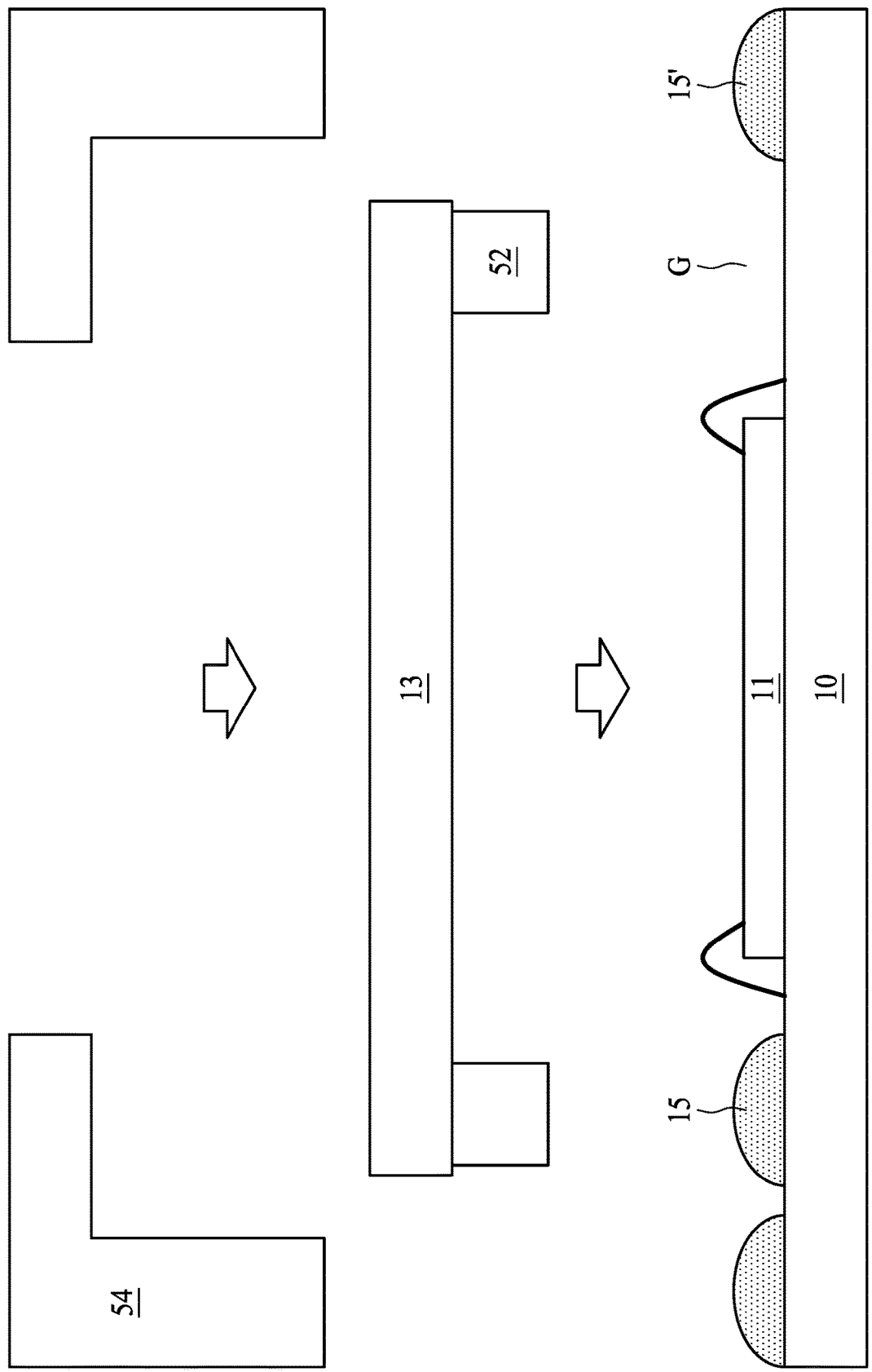
FIG. 15 illustrates a method of manufacturing a semiconductor device package according to some embodiments of the present disclosure.

FIG. 15 illustrates a method of manufacturing a semiconductor device package 5 according to some embodiments of the present disclosure. A semiconductor device 11 is bonded and wire bonded to a substrate 10. An adhesive layer 15' is applied to an outer periphery of the substrate 10. An adhesive 15 is applied to a portion of the substrate 10 corresponding to a supporting element 52.

A transparent plate 13 is attached to the supporting element 52. The supporting element 52 is attached to the substrate 10. The supporting element 52 is secured to the substrate 10 via the adhesive 15. The lid 54 is attached to the substrate 10. The lid 54 is secured to the substrate 10 via the adhesive layer 15'.

The adhesive 15 defines a gap (G). The adhesive 15 discontinuously surrounds the semiconductor device 11 (e.g. surrounds a portion of the semiconductor device 11). One end of the adhesive 15 is separated from another end of the adhesive 15 with the gap (G). At a portion corresponding to the gap (G), the supporting element 52 is separated from the substrate 10.

In some embodiments, a panel of semiconductor device packages 5 is singulated by a singulation operation. A strip sheet of semiconductor device packages 5 is singulated by a singulation operation.

Figure 16:
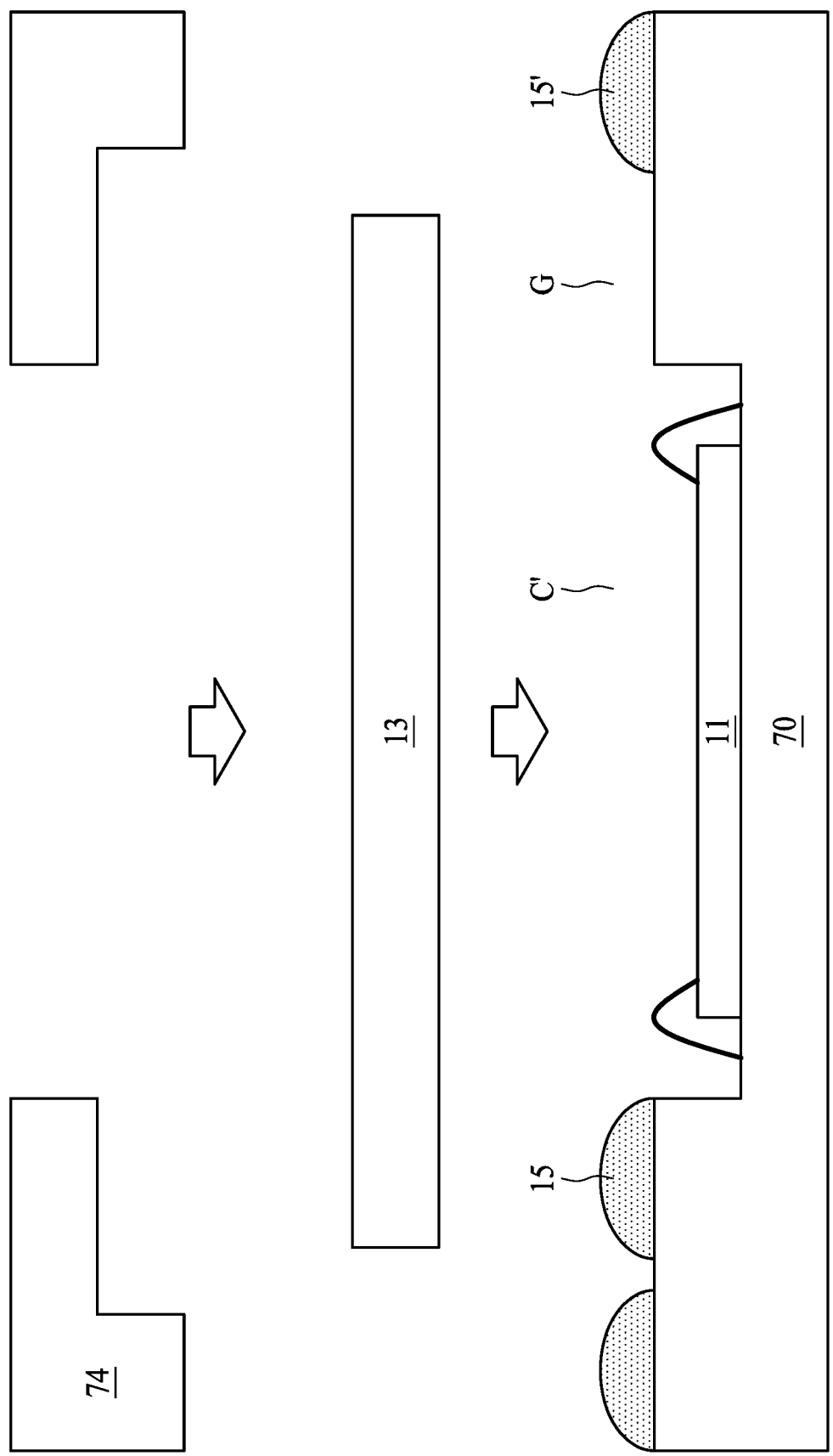
FIG. 16 illustrates a method of manufacturing a semiconductor device package according to some embodiments of the present disclosure.

FIG. 16 illustrates a method of manufacturing a semiconductor device package 7 according to some embodiments of the present disclosure. A semiconductor device 11 is bonded and wire bonded to a substrate 70. A semiconductor device 11 is disposed in a cavity (C') defined by the substrate 70. An adhesive layer 15' is applied to an outer periphery of the substrate 70. An adhesive 15 is applied to a portion of the substrate 70 corresponding to a transparent plate 13.

The transparent plate 13 is attached to the substrate 70. The transparent plate 13 is secured to the substrate 70 via the adhesive 15. A lid 74 is attached to the substrate 70. The lid 74 is secured to the substrate 70 via the adhesive layer 15'.

The adhesive 15 defines a gap (G). The adhesive 15 discontinuously surrounds the semiconductor device 11 (e.g. surrounds a portion of the semiconductor device 11). One end of the adhesive 15 is separated from another end of the adhesive 15 with the gap (G). At a portion corresponding to the gap (G), the substrate 70 is separated from the transparent plate 13.

In some embodiments, a panel of semiconductor device packages 7 is singulated by a singulation operation. A strip sheet of semiconductor device packages 7 is singulated by a singulation operation.

Figure 17:
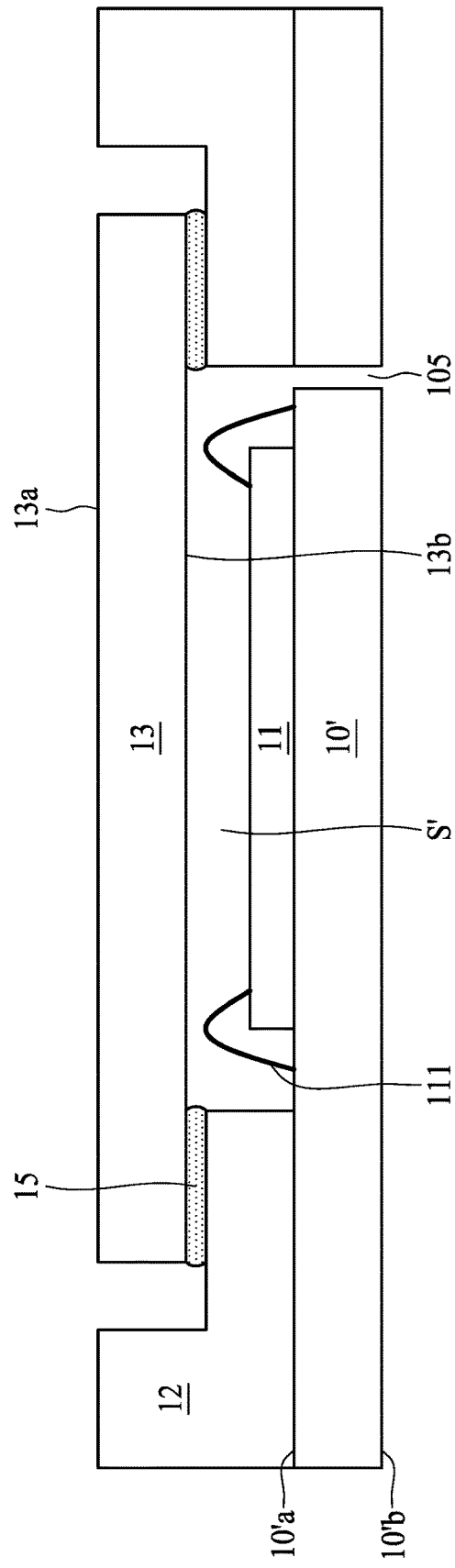
FIG. 17 illustrates a cross-sectional view of a comparative semiconductor device package.

FIG. 17 illustrates a cross-sectional view of a comparative semiconductor device package 9. The semiconductor device package 9 includes a substrate 10', a semiconductor device 11, a lid 12, a transparent plate 13, and an adhesive 15.

The substrate 10' has an upper surface 10'a and a lower surface 10'b opposite to the upper surface 10'a. The lid 12 is disposed on the upper surface 10'a of the substrate 10'. The lid 12 is secured to the substrate 10' via an adhesive layer 15' (not denoted in FIG. 17). The semiconductor device 11 is disposed on the upper surface 10'a of the substrate 10'. The semiconductor device 11 may include an optical sensor or other suitable devices. The substrate 10' defines a vent hole 105. The vent hole 105 in the substrate 10' might mitigate against detachment of the lid 12 due to a pop-corn effect at elevated temperatures during manufacturing. However, the vent hole 105 may lead to light leakage as well as water and particle contaminants can enter into an inner space of the comparative semiconductor device package 9.

The adhesive 15 is disposed on an inner periphery of the lid 12. The adhesive 15 continuously surrounds the semiconductor device 11. The transparent plate 13 is disposed on the lid 12 via the adhesive 15. A filter layer (not denoted in FIG. 17) may be applied to cover the upper surface 13a and the lower surface 13b of the transparent plate 13 to mitigate against light leakage that adversely impacts detection sensitivity (e.g. of the semiconductor device 11). Since the side surfaces of the transparent plate 13 are not covered by the filter layer and are spaced from the lid 12, light leakage through the side surfaces of the transparent plate 13 may occur.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane. For example, a surface can be deemed to be planar or substantially planar if a difference between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
   a supporting element; and
   a plate supported by the supporting element, the plate including a top surface facing away from the supporting element;
   wherein the supporting element and the plate define an opening connected to the top surface of the plate and an outside of the semiconductor device package.

2. The semiconductor device package of claim 1, further comprising a carrier, wherein the supporting element is sandwiched between the plate and the carrier.

3. The semiconductor device package of claim 2, wherein the opening includes a portion under the plate and over the carrier.

4. The semiconductor device package of claim 1, further comprising a lid at least partially disposed over the plate and a semiconductor device disposed under the plate, wherein a vertical projection of the lid is outside of a vertical projection of the semiconductor device.

5. The semiconductor device package of claim 4, wherein the lid includes a sloped side surface.

6. The semiconductor device package of claim 4, wherein the lid is spaced apart from the top surface of the plate by a gap.

7. The semiconductor device package of claim 4, further comprising a channel exposed to the outside of the semiconductor device package and connecting the opening and the outside of the semiconductor device package, wherein the channel comprises a portion between the lid and the plate.

8. A semiconductor device package, comprising:
   a carrier;
   a supporting element disposed over the carrier;
   a plate disposed over the supporting element, and
   an adhesive bonding the plate and the supporting element;
   wherein the carrier and the supporting element collectively define a cave, and a vertical projection of the cave on the carrier is within a vertical projection of the plate on the carrier; and
   wherein the supporting element, the adhesive and the plate collective define a gap configured to release fluid from the cave to outside of the semiconductor device package.

9. The semiconductor device package of claim 8, wherein the adhesive protrudes beyond a lateral surface of the plate.

10. The semiconductor device package of claim 8, wherein a thickness of the gap is defined by a thickness of the adhesive.

11. The semiconductor device package of claim 8, further comprising a channel communicating with the outside of the semiconductor device package and connected to the gap, and the channel including a first portion extending along a top surface of the plate.

12. The semiconductor device package of claim 11, wherein the channel further includes a second portion connected to the first portion, and the second portion is non-parallel to the first portion.

13. The semiconductor device package of claim 12, wherein the second portion includes a neck portion adjacent to a lateral surface of the plate.

14. The semiconductor device package of claim 12, wherein the second portion extends downwardly to an upper surface of the carrier.

15. The semiconductor device package of claim 11, wherein the channel passes by a lateral surface of the plate.

16. The semiconductor device package of claim 8, wherein the gap is adjacent to an inner corner of the supporting element from a top view.

17. The semiconductor device package of claim 8, wherein the adhesive includes an asymmetric layout.

18. A semiconductor device package, comprising:
   a carrier;
   a supporting element disposed over the carrier; and
   a plate supported by the supporting element through an adhesive bonding the plate and the supporting element;
   wherein the plate, the supporting element, and the adhesive defines a cavity,
   wherein the plate and the supporting element define a gap configured to release air from the cavity to outside of the semiconductor device package.

19. The semiconductor device package of claim 18, wherein the carrier includes a recess, and the recess connects to the cavity and includes a surface lower than a top surface of the carrier.

20. The semiconductor device package of claim 19, wherein the recess extends under the supporting element.

* * * * *